United States Patent
Iwamura et al.

(10) Patent No.: US 11,960,379 B2
(45) Date of Patent: Apr. 16, 2024

(54) SIMULATION SYSTEM, METHOD FOR SIMULATION SYSTEM, AND NON-TRANSITORY COMPUTER-READABLE STORAGE MEDIUM STORING SIMULATION PROGRAM

(71) Applicant: OMRON CORPORATION, Kyoto (JP)

(72) Inventors: Shintaro Iwamura, Kyoto (JP); Haruna Ohnuki, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 145 days.

(21) Appl. No.: 17/825,467

(22) Filed: May 26, 2022

(65) Prior Publication Data
US 2023/0004480 A1 Jan. 5, 2023

(30) Foreign Application Priority Data

Jun. 30, 2021 (JP) ................................ 2021-108831

(51) Int. Cl.
*G06F 11/36* (2006.01)
(52) U.S. Cl.
CPC ...... *G06F 11/3636* (2013.01); *G06F 11/3664* (2013.01)
(58) Field of Classification Search
CPC .......................... G06F 11/3664; G06F 11/3636
See application file for complete search history.

(56) References Cited

U.S. PATENT DOCUMENTS

| 5,768,160 A * | 6/1998 | Kakegawa ........... G06F 11/3457 703/16 |
| 10,719,645 B1 * | 7/2020 | Zhang ................. G06F 30/3323 |
| 2003/0182597 A1 * | 9/2003 | Coha ................... G06F 11/3457 714/48 |

(Continued)

FOREIGN PATENT DOCUMENTS

| CN | 109814478 B * | 4/2020 |
| CN | 113255161 A * | 8/2021 |

(Continued)

OTHER PUBLICATIONS

Partial European Search Report dated Nov. 22, 2022 in Application No. 22175658.8.

*Primary Examiner* — Phillip H Nguyen
(74) *Attorney, Agent, or Firm* — Sughrue Mion, PLLC

(57) ABSTRACT

Provided is a simulation technique that allows the program verification to be more efficiently performed. A simulation system includes: a simulator that executes simulation of an operation of one or more devices; a data input unit that obtains one or more execution times in the simulation, positional information of each one of objects in the simulation, and a value of each one of one or more variables referred to by a program to operate the devices; a data recorder that stores, as a first log, positional information of the objects and value of the variables for each of the one or more execution times in a manner that positional information and value are associated with each other; and a displayer that displays positional information of the objects and value of the variables for each of the one or more execution times included in first log.

20 Claims, 17 Drawing Sheets

(56) References Cited

U.S. PATENT DOCUMENTS

| | | | |
|---|---|---|---|
| 2009/0106005 A1* | 4/2009 | Kondo | G06F 30/20 703/7 |
| 2015/0112460 A1 | 4/2015 | Sakaguchi et al. | |
| 2019/0325093 A1 | 10/2019 | Schreder et al. | |
| 2021/0117186 A1* | 4/2021 | Ooi | G06F 8/73 |

FOREIGN PATENT DOCUMENTS

| | | | | |
|---|---|---|---|---|
| EP | 3502903 | A1 | * | 6/2019 |
| JP | 2007334812 | A | * | 12/2007 |
| JP | 2010182218 | A | * | 8/2010 |
| JP | 2021-045797 | A | | 3/2021 |

* cited by examiner

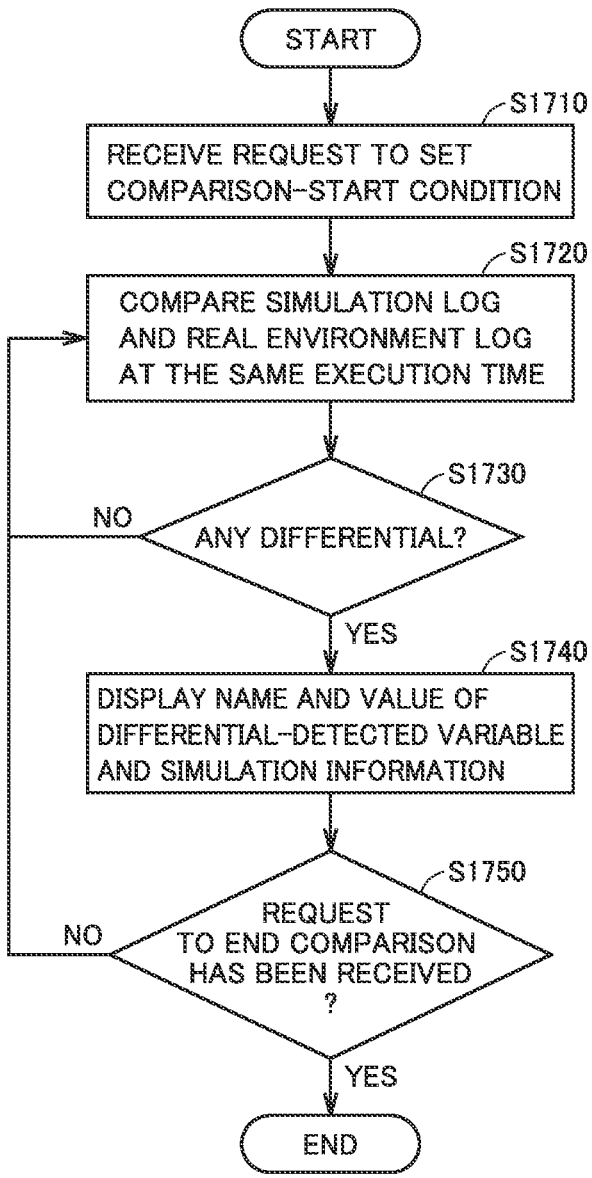

SIMULATION SYSTEM, METHOD FOR SIMULATION SYSTEM, AND NON-TRANSITORY COMPUTER-READABLE STORAGE MEDIUM STORING SIMULATION PROGRAM

BACKGROUND OF THE INVENTION

Field of the Invention

The present disclosure relates to a simulation system, more particularly to a program debugging feature.

Description of the Background Art

Computer-assisted simulations have been applied to various technical fields. Such simulations may be a great help for preliminary discussions and considerations of devices and apparatuses even before they are ready to be used.

Japanese Patent Laying-Open No. 2021-045797 describes an apparatus usable for the simulations. This apparatus is provided with a first behavior calculator and a second behavior calculator. The first behavior calculator calculates the behavior of a first target disposed in a virtual space that corresponds to a first device mounted with an accessory device. The second behavior calculator calculates the behavior of a second target disposed in a virtual space that corresponds to a second device mounted with an accessory device. It is further described in this literature that, for each one of predetermined time steps, the first behavior calculator calculates the behavior of the first target corresponding to the first device mounted with the accessory device in the relevant time step, and the second behavior calculator calculates the behavior of the accessory device mounted on the first device on the basis of the calculated behavior of the first target (refer to the "Abstract").

SUMMARY OF THE INVENTION

The technique described in Japanese Patent Laying-Open No. 2021-045797, may demand that the simulations be repeatedly reproduced in order to verify the programs to operate the devices. This apparatus, therefore, may often require a great deal of time for the program verification. Thus, a simulation technique that allows the program verification to be more efficiently performed is required.

The present disclosure has been made in view of the above background, and an object in an aspect is to provide a simulation technique that allows the program verification to be more efficiently performed.

In an embodiment of this disclosure, a simulation system is provided. The simulation system includes: a simulator configured to execute a simulation of an operation of one or more devices; a data input unit configured to obtain one or more execution times in the simulation, positional information of each one of one or more objects in the simulation, and a value of each one of one or more variables referred to by a program to operate the one or more devices; a data recorder configured to store, as a first log, the positional information of the one or more objects and the value of the one or more variables for each of the one or more execution times in a manner that the positional information and the value are associated with each other; and a displayer configured to display the positional information of the one or more objects and the value of the one or more variables for each of the one or more execution times included in the first log.

As disclosed herein, the simulation system may present the positional information of the one or more objects and the value of the one or more variables for each of the one or more execution times. This may allow a user to check both of the object position and variable value referred to by the program for each of the execution times of the simulation. In case, for example, the position or the operation of the object at an execution time A is not intended, the user can immediately check the variable value at the execution time A (can easily find a problem of the program) and thereby can debug the program efficiently.

In the simulation system disclosed herein, the simulator is configured to reproduce the simulation while stopping the simulation for each of the one or more execution times based on the first log. The displayer is configured to display a screen of the simulation for each of the one or more execution times and the first log for each of the execution times.

As disclosed herein, the simulation system may reproduce the simulation while stopping the simulation for each of the execution times.

In the simulation system disclosed herein, the simulator is configured to reversely reproduce the simulation while stopping the simulation for each of the one or more execution times based on the first log. The displayer is configured to display a screen of the simulation for each of the one or more execution times and the first log for each of the execution times.

As disclosed herein, the simulation system may reversely reproduce the simulation while stopping the simulation for each of the execution times. For example, a user can more closely follow the operation of the program by slightly rewinding the problematic simulation scene.

The simulation system disclosed herein further includes a data differential extractor configured to extract a differential between the first log and data previously recorded. The data recorder is configured to store the differential.

As disclosed herein, the simulation system can save the memory capacity of the log by storing only the differential.

In the simulation system disclosed herein, the data input unit further includes a feature that obtains one or more time stamps in a real environment, positional information of one or more objects in the real environment, and a value of one or more variables referred to by the program to operate the one or more devices in the real environment. The data recorder further includes a feature that stores, as a second log, the positional information of the one or more objects in the real environment and the value of the one or more variables referred to by the program to operate the one or more devices in the real environment for each of the one or more time stamps in the real environment in a manner that the positional information and the value are associated with each other.

As disclosed herein, the simulation system can obtain the log in the real environment as well as the log in the simulation.

The simulation system disclosed herein further includes a synchronizer configured to allow an execution time of the first log and an execution time of the second log to correspond to each other. The displayer is configured to display the first log and the second log at a same execution time.

As disclosed herein, the simulation system may synchronize and display the execution time of the first log in the simulation and the execution time of the second log in the real environment in a manner that the first and second logs are comparable to each other.

In the simulation system disclosed herein, the displayer is configured to display a graph of the value of the one or more variables for each of the one or more execution times included in the first log.

As disclosed herein, the simulation system can intuitively display any change in the value of the one or more variables using the graph.

In the simulation system disclosed herein, the displayer is configured to display an operation of the program while reproducing the operation based on the value of the one or more variables for each of the one or more execution times included in the first log.

The simulation system disclosed herein may present, to a user, the program status for each of the one or more execution times based on the value of the one or more variables.

In the simulation system disclosed herein, the displayer is configured to display a screen of the simulation for each of the one or more execution times in the simulation and a flowchart of the program for each of the one or more execution times in the simulation. The displayer is configured to highlight and display a process on the flowchart currently executed for each of the one or more execution times in the simulation.

As disclosed herein, the simulation system may simultaneously present, to a user, the simulation screen and the currently executed process on the flowchart.

In the simulation system disclosed herein, the simulator further includes a feature that receives an input for selection of a variable having a value to be traced for each of the one or more execution times from the one or more variables included in the program.

As disclosed herein, the simulation system allows a user to select a variable that needs to be traced.

In the simulation system disclosed herein, the simulator further includes a feature that receives an input for setting a reproduction starting time and a reproduction ending time of the simulation.

As disclosed herein, the simulation system can receive the input for setting the reproduction starting time and the reproduction ending time of the simulation.

In the simulation system disclosed herein, the data recorder is configured to record a cycle and step count when the program is executed as an execution time in the simulation.

As disclosed herein, the simulation system can record the cycle and step count when the program is executed as the execution time in the simulation.

In another embodiment of this disclosure, a method executable by a simulation system is provided. The method includes: executing a simulation of an operation of one or more devices; obtaining one or more execution times in the simulation, positional information of one or more objects in the simulation, and a value of one or more variables referred to by a program to operate the one or more devices; storing, as a first log, the positional information of the one or more objects and the value of the one or more variables for each of the one or more execution times in a manner that the positional information and the value are associated with each other; and displaying the positional information of the one or more objects and the value of the one or more variables for each of the one or more execution times included in the first log.

According to the method disclosed herein, the positional information of the one or more objects and the value of the one or more variables may be both presented for each of the one or more execution times. This may allow a user to check both of the object position and variable value referred to by the program for each of the execution times of the simulation.

In yet another embodiment of this disclosure, a non-transitory computer-readable medium comprising instructions is provided. The instructions, when executed by a simulation system, cause the simulation system to: execute a simulation of an operation of one or more devices; obtain one or more execution times in the simulation, positional information of one or more objects in the simulation, and a value of one or more variables referred to by a program to operate the one or more devices; store, as a first log, the positional information of the one or more objects and the value of the one or more variables for each of the one or more execution times in a manner that the positional information and the value are associated with each other; and display the positional information of the one or more objects and the value of the one or more variables for each of the one or more execution times included in the first log.

As disclosed herein, the positional information of the one or more objects and the value of the one or more variables may be both presented for each of the one or more execution times. This may allow a user to check both of the object position and variable value referred to by the program for each of the execution times of the simulation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a flowchart illustrating an example of a comparison process for between a program simulation result by simulation system 500 and a program execution result in a real environment.

DESCRIPTION OF THE PREFERRED EMBODIMENTS

Embodiments of the technical idea according to the present disclosure are hereinafter described with reference to the accompanying drawings. In the description below, like components are illustrated with the same reference signs. Also, they are referred to likewise and have similar functional features. Such components, therefore, will not be repeatedly described in detail.

<A. Example of Application>

Figure 1:
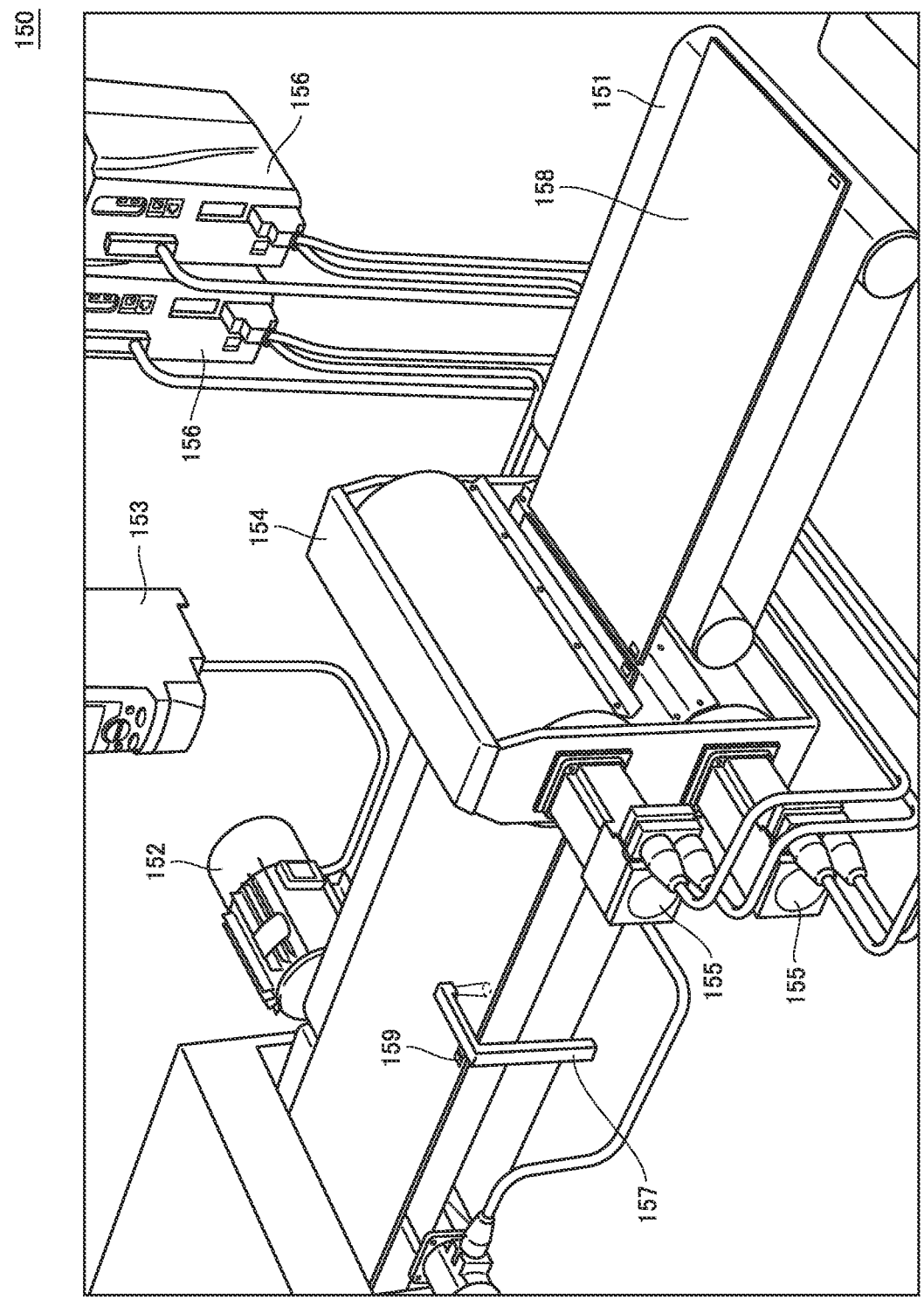
FIG. 1 is a diagram illustrating an example of a device whose operation can be simulated by a simulation system according to an embodiment.
Figure 2:
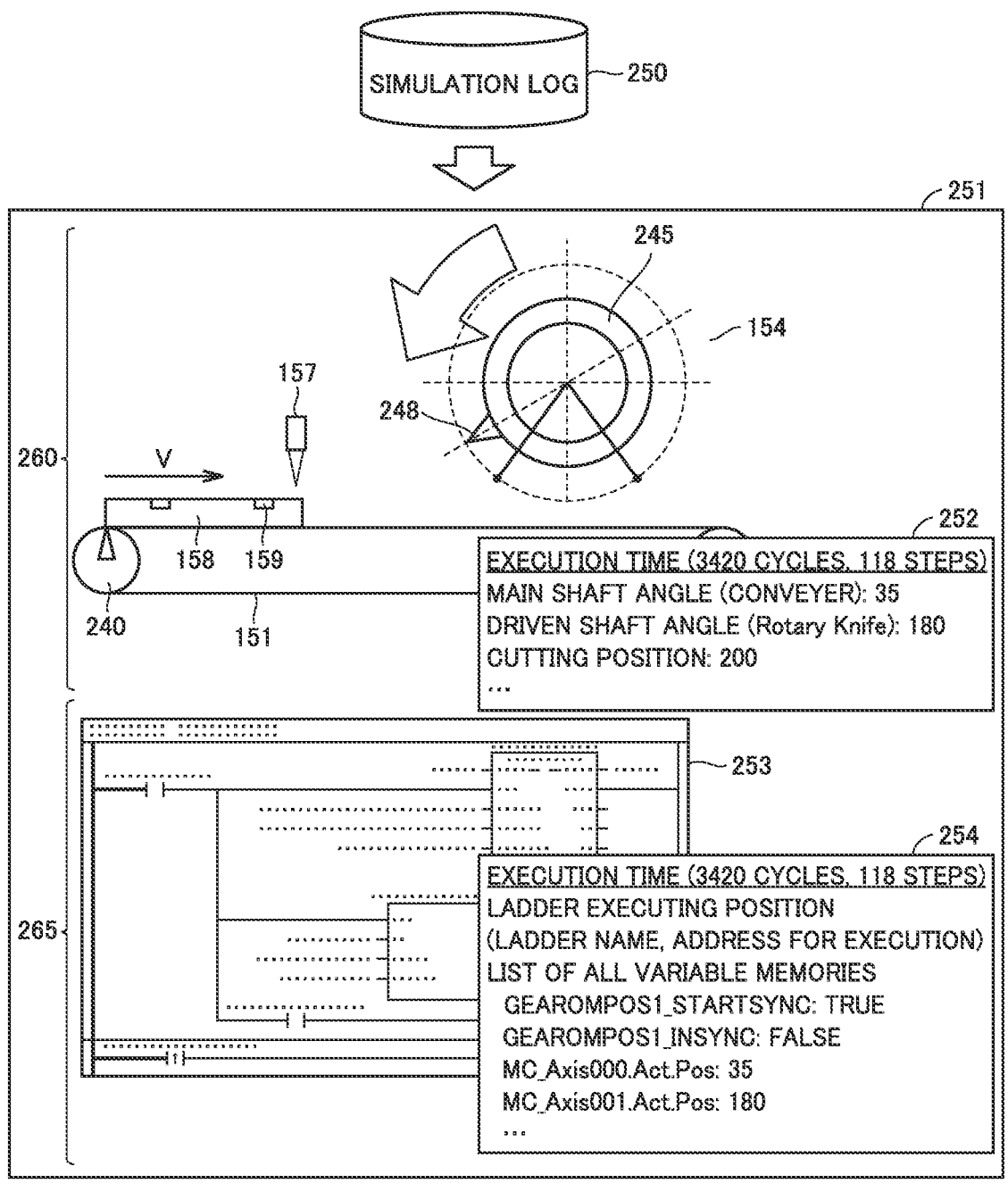
FIG. 2 is a diagram illustrating an example of simulation being executed by simulation system 500.

An exemplified scene to which the present invention is applied is described referring to FIGS. 1 and 2.

(a. Device Targeted for Simulation)

FIG. 1 is a diagram illustrating an example of a device whose operation can be simulated by a simulation system according to an embodiment. A simulation system 500 according to this embodiment (see FIG. 5) may simulate the operation of an optional device used in factory automation (FA) in plants and the like. Simulation system 500 may simulate the operation of robot arms, belt conveyers, rotary knives, sensors and any other optional device(s), and the operations of combinations of these.

A device 150 illustrated in FIG. 1 is a multifunction device including a conveyer 151 and a rotary knife 154. Device 150 has a cutting feature that allows a sheet 158 carried on conveyer 151 to be cut in a predetermined length. Device 150 includes the following components; conveyer 151, a motor 152, a motor controller 153, rotary knife 154, a motor 155, a motor controller 156, and a sensor 157.

Conveyer 151 transports sheet 158. Motor 152 is connected to a main shaft serving to rotate the conveyer and drives conveyer 151. Motor controller 153 controls the speed or torque of motor 152.

Rotary knife 154 includes a rotatable roller and a knife attached onto this roller. As a result of the roller being rotated, the knife cuts sheet 158 carried on conveyer 151. Motor 155 is connected to the roller of rotary knife 154 and drives rotary knife 154. Motor controller 156 controls the speed or torque of motor 155.

Sensor 157 detects a cutting position 159 on sheet 158. Rotary knife 154 cuts the sheet at cutting position 159 detected by sensor 157.

Figure 3:
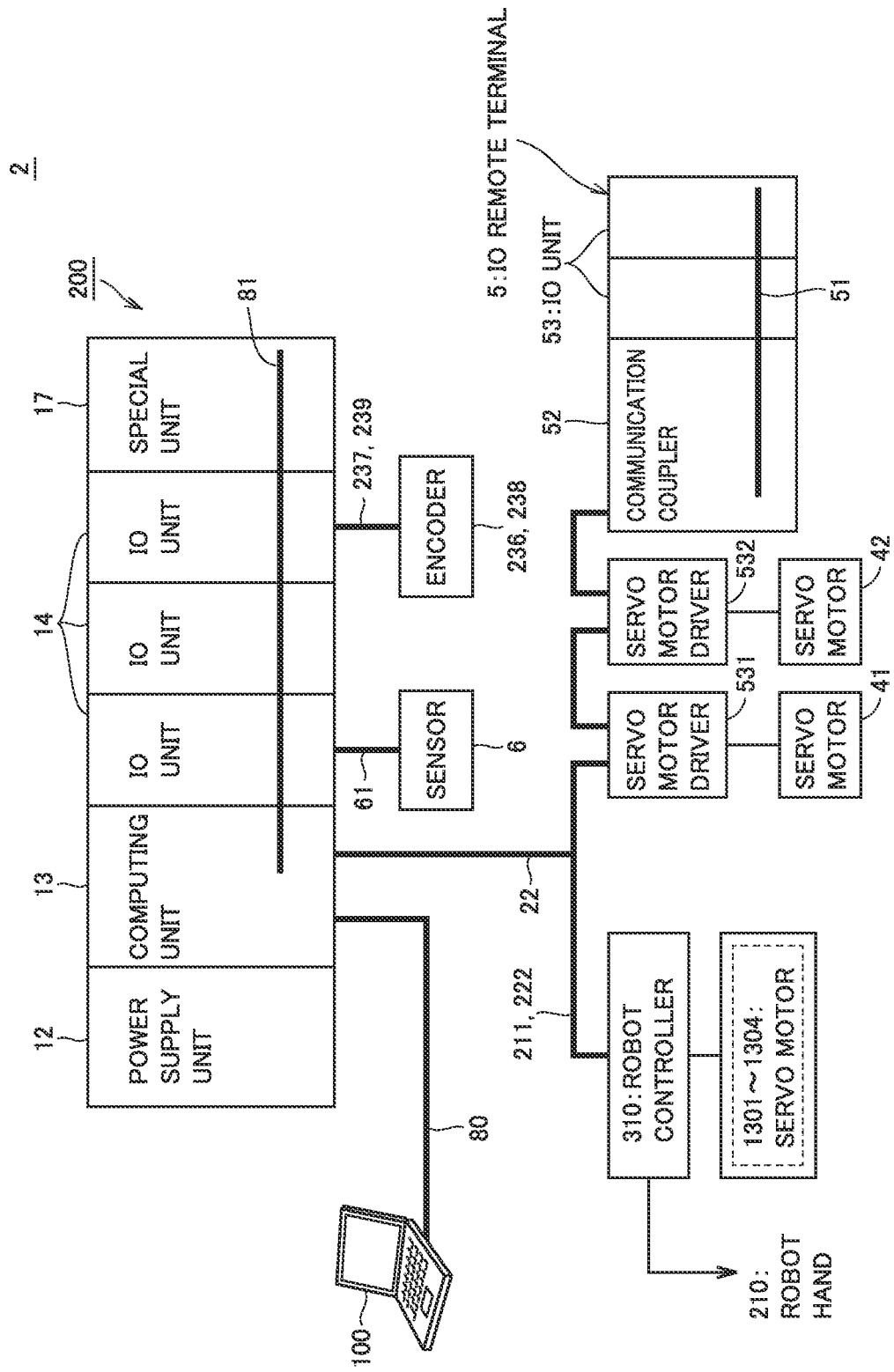
FIG. 3 is a diagram illustrating an example of a unit configuration of a control system 2 including devices to which a simulation technique according to the embodiment is applicable.

Motor controllers 153 and 156 and sensor 157 may be connected to a programmable logic controller (PLC) 200 (see FIG. 3). In this case, PLC 200 may read a signal from sensor 157 and control rotary knife 154 based on the read signal. PLC 200 controls device 150 on the basis of a program installed therein.

Simulation system 500 reproduces, in an ongoing simulation, the operation of program-installed PLC 200 and the operation of device 150 controlled by PLC 200. Thus, a user may debug the program of the PLC by checking the operation of device 150 in the simulation. In an aspect, the program that can be simulated by simulation system 500 may be an IEC program. The IEC program is a program that conforms to the IEC 61131-3 standards. This program includes a ladder program, structured text (ST), and the like.

(b. Functional Features of Simulation System)

FIG. 2 is a diagram illustrating an example of simulation being executed by simulation system 500. Referring to FIG. 2, functional features of simulation system 500 are hereinafter described. Simulation system 500 includes a simulation recording feature and a program debugging feature using a recorded simulation result. The description is given below to the features of simulation system 500 using device 150 as an example.

(b-1. Simulation Recording Feature)

First, the simulation recording feature is described. As described, simulation system 500 reproduces the operation of program-installed PLC 200 and the operation of device 150 controlled by PLC 200, in a simulation using a three-dimensional (3D) space.

At the time, simulation system 500 records a simulation log 250. Simulation log 250 contains positional information 252 of an object in the 3D space for each execution time (or execution timing) of the program, and also contains a variable value 254 of the program for each execution time. The object described herein in the 3D space may include, for example, a device in the 3D space, a component(s) constituting the device, a work, any other optional object(s), and a combination(s) of these items.

In an aspect, the execution time (or execution timing) may be defined by the number of command steps of the program and the number of times when the program is repeatedly executed (cycles). The step may refer to one command of the program or commands in one row of the program entered in the editor (one command of the ladder program, commands in one row of ST entered in the editor, or the like). When one command or commands in one row of the program (one command of the ladder program, commands in one row of ST entered in the editor, or the like) has been executed, the program may be regarded as having proceeded by one step. Intervals between the steps may be determined by the command cycles of PLC 200. An example is given below, in which the program contains commands for 10 steps. In this case, the program has been executed once (one cycle) at a point of time when execution of the commands for 10 steps is completed, and the program has been repeatedly executed 10 times (cycles) at a point of time when execution of the commands for 100 steps is completed. In another aspect, the execution time (or execution timing) may be defined by an optional time interval (one second, 100 milliseconds, or the like) determined beforehand.

In the example illustrated in FIG. 2, simulation system 500 records positional information 252 of the object in the 3D space and variable value 254 of the program at a certain execution time (3420 cycles, 118 steps) as simulation log 250 in a manner that they are associated with each other.

Positional information 252 of the object in the 3D space contains the positional information of each of one or more objects present in the 3D space. In the example illustrated in FIG. 2, positional information 252 of the object in the 3D space may contain the angle of a main shaft 240 (shaft of the conveyer connected to motor 152), the angle of a driven shaft 245 (roller of rotary knife 154), a cutting position 248 (blade position), and positions of the other objects.

Variable value 254 of the program includes values of one or more variables referred to by a program 253 installed in PLC 200. In the example illustrated in FIG. 2, variable value 254 of the program includes values of GEAROMPOS1_STARTSYNC, GEAROMPOS1_INSYNC, MC_Axis000.Act.Pos, MC_Axis001.Act.Pos, and values of other variables.

(b-2. Debugging Feature)

Next, the debugging feature is described. On the basis of simulation log 250, simulation system 500 may reproduce the simulation and then display a simulation scene on a screen 251 for each step.

Screen 251 includes a display 260 of the 3D space, a display 265 of the program, positional information 252 of the object in the 3D space per execution time, and variable value 254 of the program per execution time.

Simulation system 500 includes a feature that reproduces or reversely reproduces the simulation while pausing the simulation for each step on the basis of an operation input from a user.

For example, a simulation scene is assumed represent a first execution time. In this case, screen 251 presents display 260 of the 3D space, display 265 of the program, positional information 252 of the object in the 3D space, and variable value 254 of the program at the first execution time.

For example, the simulation scene is assumed to have proceeded (or returned) by one step from the first execution time to a second execution time based on an operation input from a user. In this case, screen 251 presents display 260 of the 3D space, display 265 of the program, positional information 252 of the object in the 3D space, and variable value 254 of the program at the second execution time. In an aspect, display 265 of the program may include a state of execution of the program to which variable value 254 of the program has been assigned.

By referring to screen 251, a user can check display 260 of the 3D space, display 265 of the program, positional information 252 of the object in the 3D space, and variable value 254 of the program at the same time. Therefore, the user may easily debug the program while checking the operation of device 150.

<B. System Configuration>

Next, referring to FIGS. 3 to 5, the whole structural features of a system to be simulated by simulation system 500, hardware configurations of a device that operates as simulation system 500, and functional configurations of simulation system 500 are hereinafter described.

FIG. 3 is a diagram illustrating an example of a unit configuration of a control system 2 including devices to which a simulation technique according to this embodiment is applicable. Device 150 illustrated in FIG. 1 may be actualized as part of control system 2.

Control system 2 includes, for example, PLC 200, an IO remote terminal 5 and servo motor drivers 531 and 532 that are connected to PLC 200 through a field network 22, a robot controller 310, and IO devices disposed in the field (a sensor 6, encoders 236, 238, and the like).

PLC 200 includes a computing unit 13 that executes main computing processes, one or more IO units 14, and a special unit 17. These units are configured to transmit and receive data to and from one another through a system bus 81 and receive power supply from a power supply unit 12. A device 100 for simulation use is connectable to computing unit 13.

Device 100 may operate as simulation system 500. Device 100 may install, in computing unit 13, a program whose operation has been verified by the simulation. Computing unit 13 may control each device in control system 2 on the basis of the installed program. Device 100 may be connected to computing unit 13 through a network 80.

IO unit 14 collects detected values 61, 237 and 239 from the IO devices including sensor 6 and encoders 236 and 238. For example, sensor 6 may be sensor 157 that detects cutting position 159 of sheet 158 illustrated in FIG. 1. Encoders 236 and 238 may be attached to motor 152 that drives conveyer 151 or motor 155 that drives rotary knife 154. The detected values from the IO devices is set (written in) to corresponding bits of a memory of IO unit 14.

Computing unit 13 executes computations of the control program using values collected by IO unit 14 and sets (writes in) values of an obtained result to corresponding bits in IO unit 14. A peripheral device(s) or the IO devices are operated with reference to the bit values in IO unit 14. Thus, PLC 200 can control robot, conveyer, or the like, which are to be controlled, by transmitting and receiving data to and from the IO devices and the peripheral device(s) through IO unit 14.

Special unit 17 has features unsupported by IO unit 14, including input and output of analog data, temperature control, communication through a particular communication system.

For example, robot controller 310, servo motor drivers 531 and 532, IO remote terminal 5, and the like may be connected to field network 22.

As with IO unit 14, IO remote terminal 5 basically carries out typical processes associated with inputs and outputs. Specifically, IO remote terminal 5 includes one or more IO units 53 and a communication coupler 52 used to carry out processes associated with data transmission in field network 22. These units are configured to transmit and receive data to and from one another through an IO remote terminal bus 51.

Servo motor drivers 531 and 532 are connected to computing unit 13 through field network 22 and drive servo motors 41 and 42 in accordance with command values received from computing unit 13. Specifically, servo motor drivers 531 and 532 receive, from PLC 200, command values including a position command value, a speed command value and a torque command value, at constant time intervals, for example, control periods. Computing unit 13 may generate these command values based on detected values 237 and 239 from encoders 236 and 238. In an aspect, servo motors 41 and 42 may be used as motor 155 that drives rotary knife 154.

Computing unit 13 refers to the detected values from the IO devices described earlier and runs a predetermined control program. Thus, computing unit 13 may allow a robot hand 210 to perform handling of a work, for example, picking up, placing and pressing down the work.

Specifically, computing unit 13 generates a control command 211 for the robot arm and a control command 222 for robot hand 210 and outputs these control command signals to robot hand 210 through robot controller 310. Computing unit 13, at the time of generating control command 211, may refer to a value indicative of the status of robot hand 210 in addition to detected values 61 of the IO devices described earlier. The robot arm may include an optional number of servo motors, for example, servo motors 1301 to 1304.

The whole control system 2 may be targeted for simulation by simulation system 500. Otherwise, only a part of configurations included in control system 2 may be targeted for simulation by simulation system 500.

Figure 4:
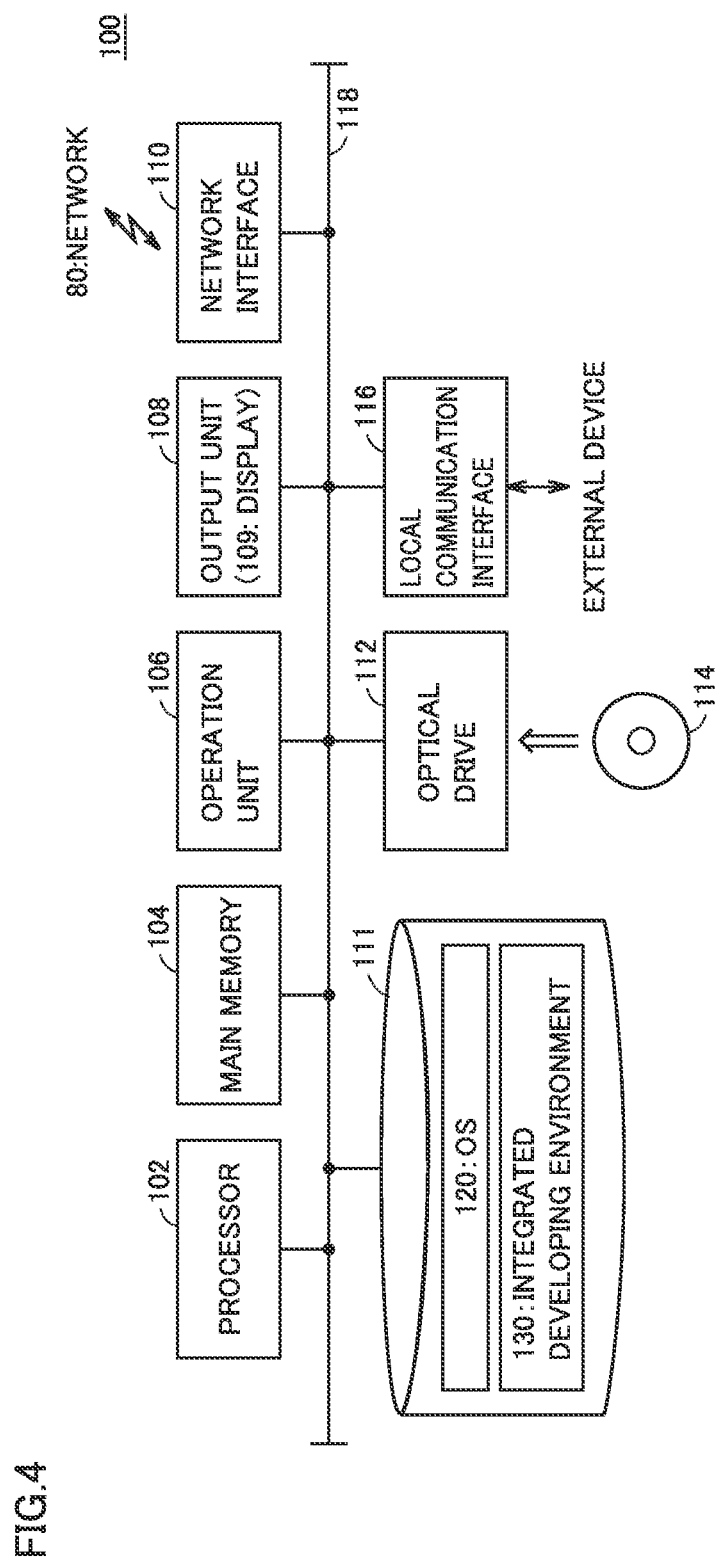
FIG. 4 is a diagram illustrating an example of a hardware configuration of device 100.

FIG. 4 is a diagram illustrating an example of a hardware configuration of device 100. Device 100 may operate as simulation system 500. In an aspect, simulation system 500 may be a system including a plurality of devices 100 or including at least a part of hardware configurations of device 100. Otherwise, simulation system 500 may be a virtual machine on a cloud platform including at least a part of hardware configurations of device 100.

Device 100 includes, as its principal components, an operating system (OS), a processor 102 that executes a program on the OS, a main memory 104 that provides a working area in which data required for processor 102 to run the program is stored, an operation unit 106 (operation input unit) through which a keyboard and/or a mouse are manipulated by a user, a display 109, indicators, an output unit 108 that outputs a processing result like a printing result, a network interface 110 connected to different networks including network 80, an optical drive 112, a local communication interface 116 that communicates with an external device(s), and a storage 111. These components are interconnected through an internal bus 118 in a manner that they are allowed to communicate data to and from one another.

Device 100 includes optical drive 112. Programs may be read through this optical drive from a computer-readable recording medium 114 and then installed into storage 111. Examples of computer-readable recording medium 114 may include optical recording media in which computer-readable programs are non-transitorily stored (for example, a digital versatile disc (DVD) or the like).

The programs to be executed by device 100 may be installed into device 100 through computer-readable recording medium 114 or may be installed into device 100 through network interface 110 from a server device or the like (not illustrated) on a network.

Storage 111 includes for example, a hard disk drive (HDD) or a flash solid state drive (SSD), and stores a program(s) executed by processor 102. Specifically, storage 111 stores an OS 120 and an integrated developing environment 130. Integrated developing environment 130 may be actualized in the form of an application that operates on OS 120.

Integrated developing environment 130 provides the functional features of simulation system 500 described referring to FIG. 1. In other words, the features of simulation system 500 can be actualized by processor 102 executing integrated developing environment 130 loaded in main memory 104.

In an aspect, the simulation recording feature and debugging feature described referring to FIG. 1 may be actualized as add-in features of integrated developing environment 130.

In an aspect, device 100 may actualize the features of integrated developing environment 130, in whole or in part, using an application specific integrated circuit (ASIC), a field-programmable gate array (FPGA), or the like.

Figure 5:
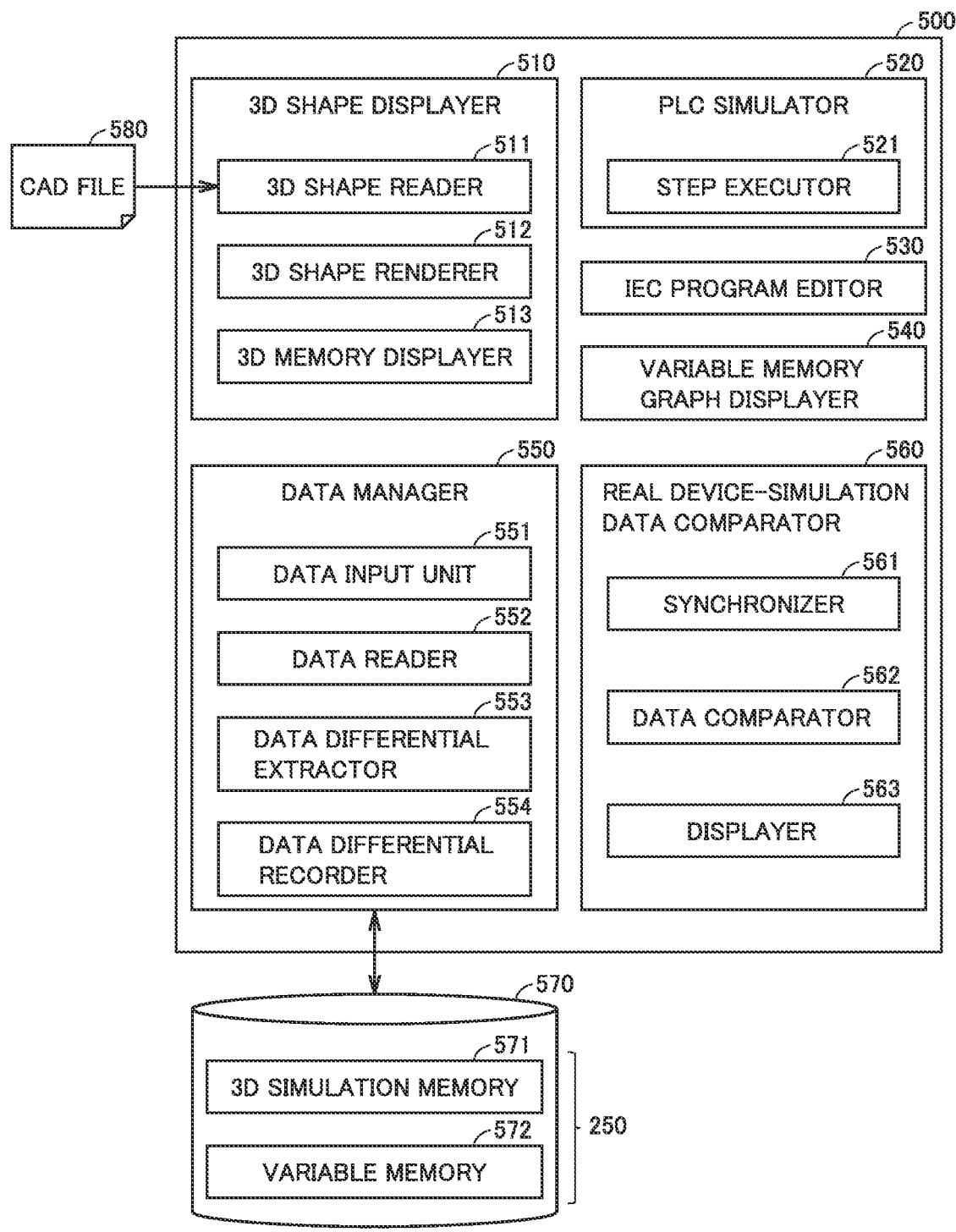
FIG. 5 is a diagram illustrating an example of functional configurations of simulation system 500.

FIG. 5 is a diagram illustrating an example of functional configurations of simulation system 500. The functional configurations illustrated in FIG. 5 may be actualized as program components. In this case, the functional configurations may be allowed to operate, as software, on hardware of device 100.

Simulation system 500 may include, as its functional configurations, a 3D shape displayer 510, a PLC simulator 520, an IEC program editor 530, a variable memory graph displayer 540, a data manager 550, a real device-simulation data comparator 560, and a repository 570.

3D shape displayer 510 renders the simulation in the 3D space on a display. To this end, 3D shape displayer 510 includes a 3D shape reader 511, a 3D shape renderer 512, and a 3D memory displayer 513.

3D shape reader 511 reads a CAD file 580 used in the simulation and converts the read CAD file 580 into a form that can be rendered by 3D shape renderer 512. In an aspect, 3D shape reader 511 may read CAD file 580 from storage 111. In another aspect, 3D shape reader 511 may read CAD file 580 input from outside through network interface 110, optical drive 112, or local communication interface 116.

3D shape renderer 512 displays the object in the 3D space (data obtained from 3D shape reader 511) and the motion of the object on display 109. The object in the 3D space may include a work or the like in addition to the devices included in control system 2. For example, 3D shape renderer 512 exhibits display 260 of the 3D space on display 109.

3D memory displayer 513 displays, on display 109, positional information 252 of the object in the 3D space per execution time. Further, 3D memory displayer 513 reads simulation log 250 from repository 570 and reproduces the simulation recorded in the past. In an aspect, 3D memory displayer 513 may use the rendering feature of 3D shape renderer 512 at the time of reproducing the simulation recorded in the past. In an aspect, 3D memory displayer 513 may render all of the screens illustrated in FIGS. 2 and 11 to 14.

PLC simulator 520 executes the program installed in PLC 200 in the ongoing simulation. To this end, PLC simulator 520 includes a step executor 521. In an aspect, PLC simulator 520 may include a display feature used at the time of reproduction of the simulation. In this case, PLC simulator 520 may render all of the screens illustrated in FIGS. 2 and 11 to 14.

Step executor 521 executes the program for each step. Step executor 521 may reproduce or reversely reproduce, for each step, simulation log 250 recorded in repository 570. Further, step executor 521 display, on display 109, variable value 254 of the program per execution time. 3D shape displayer 510 may update the display of the object in the 3D space based on the number of times when the program is executed (number of cycles) and a position at which the program is executed (step position) obtained from step executor 521.

IEC program editor 530 receives an operation input for editing of the program through operation unit 106. In an aspect, step executor 521 may carry out the simulation by immediately reflecting any program change by IEC program editor 530.

Variable memory graph displayer 540 may display a graph 1310 and the like indicative of changes of the variable value (see FIG. 13) on display 109 based on variable memory 572 recorded in repository 570.

Data manager 550 manages simulation log 250. To this end, data manager 550 includes a data input unit 551, a data reader 552, a data differential extractor 553, and a data differential recorder 554. In an aspect, data manager 550 may acquire recording settings of the simulation through operation unit 106. The recording settings of the simulation include, for example, designating the object(s) to be recorded, designating the variable(s) to be recorded, and designating the duration of the simulation being executed. Data manager 550 may record simulation log 250 based on the obtained settings. In an aspect, the duration of the simulation being executed may be set based on the starting time and ending time of the simulation. In another aspect, the duration of the simulation being executed may be set based on the numbers of steps and of cycles of the program when the program starts and the numbers of steps and of cycles of the program when the program ends.

Data input unit 551 acquires, from 3D shape displayer 510, positional information 252 of the object in the 3D space per execution time. Data reader 552 acquires, from PLC simulator 520, variable value 254 of the program per execution time.

Data reader 552 transmits data stored in a 3D simulation memory 571 to 3D shape displayer 510 at the time of debugging (when the recorded simulation is reproduced).

Similarly, data reader 552 transmits data stored in variable memory 572 to PLC simulator 520 at the time of debugging.

Data differential extractor 553 extracts a differential per execution time of data acquired by data input unit 551 (positional information 252 of the object in the 3D space and variable value 254 of the program). Specifically, data differential extractor 553 compares positional information 252 of the object in the 3D space at the first execution time against positional information 252 of the object in the 3D space at the second execution time to extract a differential between these pieces of positional information of the object. Similarly, data differential extractor 553 compares variable value 254 of the program at the first execution time against variable value 254 of the program at the second execution time to extract a differential between these variable values.

Data differential recorder 554 stores, as part of simulation log 250, the extracted differential between the positions of the object in 3D simulation memory 571. Data differential recorder 554 stores, as part of simulation log 250, the extracted differential between the variable values in variable memory 572.

If pieces of positional information 252 of the object in all of the 3D spaces and all of the program variable values 254 are stored in repository 570 for each step, simulation log 250 may certainly contain an enormous volume of data. Therefore, data differential extractor 553 and data differential recorder 554 store only a differential to the previous record in repository 570 and thereby save the memory capacity of repository 570.

Real device-simulation data comparator 560 compares the results of program execution in the simulation and in a real environment. To this end, real device-simulation data comparator 560 includes a synchronizer 561, a data comparator 562, and a displayer 563.

In an aspect, based on a signal or the like obtained from a camera-captured image or a sensor, PLC simulator 520 may output, to data manager 550, a time stamp, positional information of the object per execution time, and variable value of the program in the real environment in a manner that these pieces of information are associated with one another. Real device-simulation data comparator 560 reproduces simulation log 250 stored in repository 570 and a log in the real environment (not illustrated) and may thereby compare the results of program execution in the simulation and in the real environment.

Synchronizer 561 makes cycles in the simulation and in the real environment coincide with each other. Specifically, synchronizer 561 associates the execution time in the simulation (cycles and steps) with the execution time in the real environment (times stamp or steps and cycles of the program in the real environment).

Data comparator 562 compares the results of program execution in the simulation and in the real environment at the same execution time.

Displayer 563 may display the results of program execution in the simulation and in the real environment at the same execution time. In an aspect, displayer 563 may display, on display 109, a differential between the results of program execution in the simulation and in the real environment. In another aspect, displayer 563 may highlight and display a differential between the results of program execution in the simulation and in the real environment. This may help a user to easily correct the program in accordance with the real environment.

Repository 570 records simulation log 250. Repository 570 includes 3D simulation memory 571 and variable memory 572. In an aspect, repository 570 may be a repository of a version management system.

3D simulation memory 571 stores, for each step, positional information 252 of the object in the 3D space associated with the execution time.

Variable memory 572 stores, for each step, variable value 254 of the program associated with the execution time.

Repository 570 may record an execution log of the program in the real environment. In this case, repository 570 stores, for each step, the positional information of the object in the real environment associated with the execution time in the real environment. Likewise, repository 570 stores, for each step, the variable value of the program in the real environment associated with the execution time in the real environment.

<C. Steps of Recording Simulation Log>

Next, referring to FIGS. 6 to 10, steps of recording simulation log 250 by simulation system 500 are described. In the examples illustrated in FIGS. 6 to 10, simulation system 500 records simulation log 250 of device 150.

Figure 6:
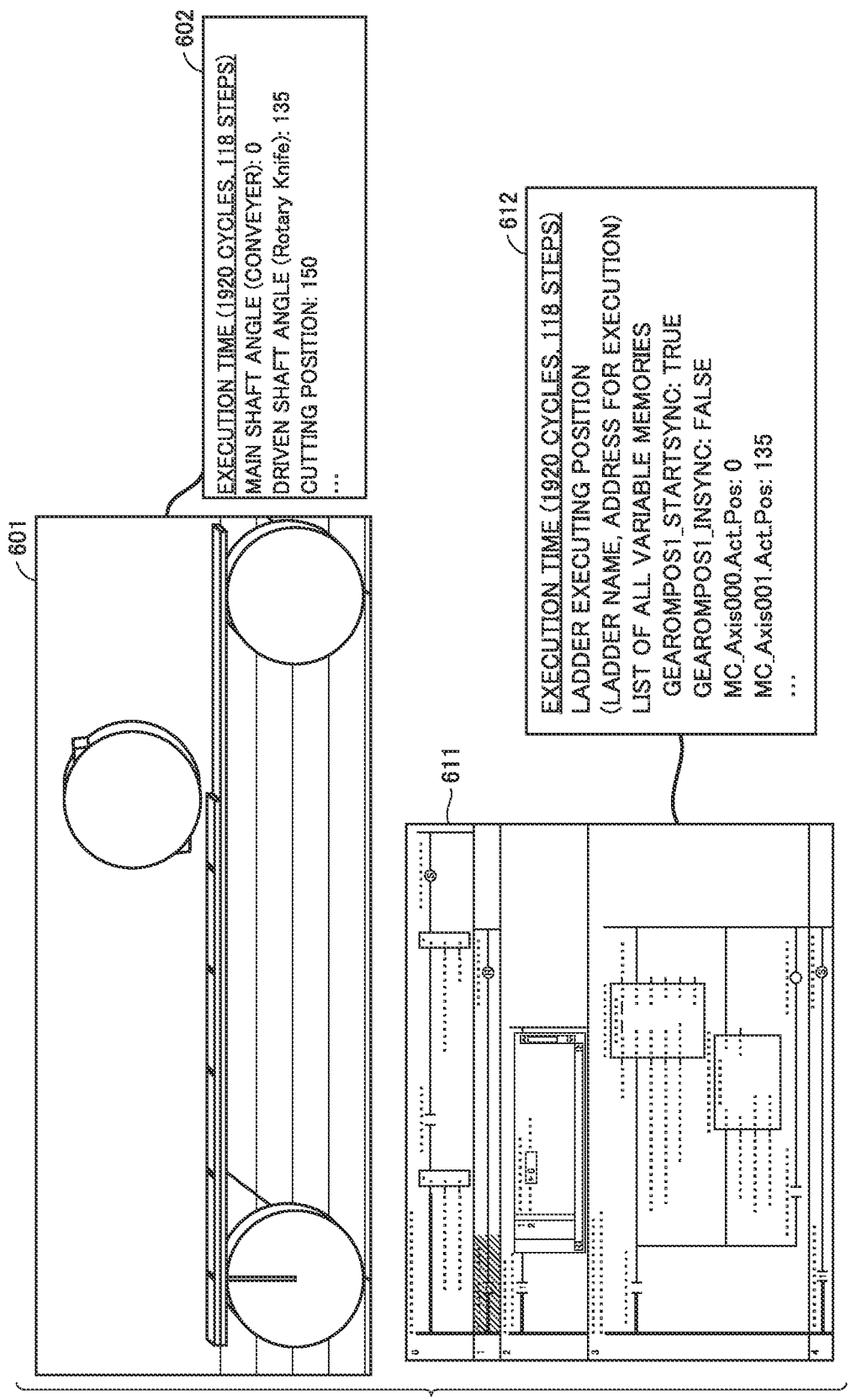
FIG. 6 is a diagram illustrating a first example of ongoing simulation.

FIG. 6 is a diagram illustrating a first example of ongoing simulation. In the example illustrated in FIG. 6, simulation system 500 is executing a program 611 in the simulation. The motion and the position of each object are reproduced in a 3D space 601. 3D space 601 includes the objects in the 3D space at an execution time (1920 cycles, 118 steps). The execution time (1920 cycles, 118 steps) may be rephrased as a point in time when PLC 200 completed the execution of program 611 1920 times and PLC 200 completed the execution of 118 steps of program 611.

Simulation system 500 stores, in repository 570, the positional information of the object in 3D space 601 and the variable value of the program at each execution time as simulation log 250 every time when PLC 200 executes program 611 for one step in the simulation. Specifically, simulation system 500 stores, in repository 570, differential information indicative of any differential to the previous record.

In the example illustrated in FIG. 6, simulation system 500 stores, in repository 570, positional information 602 of the object in the 3D space and a variable value 612 of the program at an execution time (1920 cycles, 118 steps) as simulation log 250.

Figure 7:
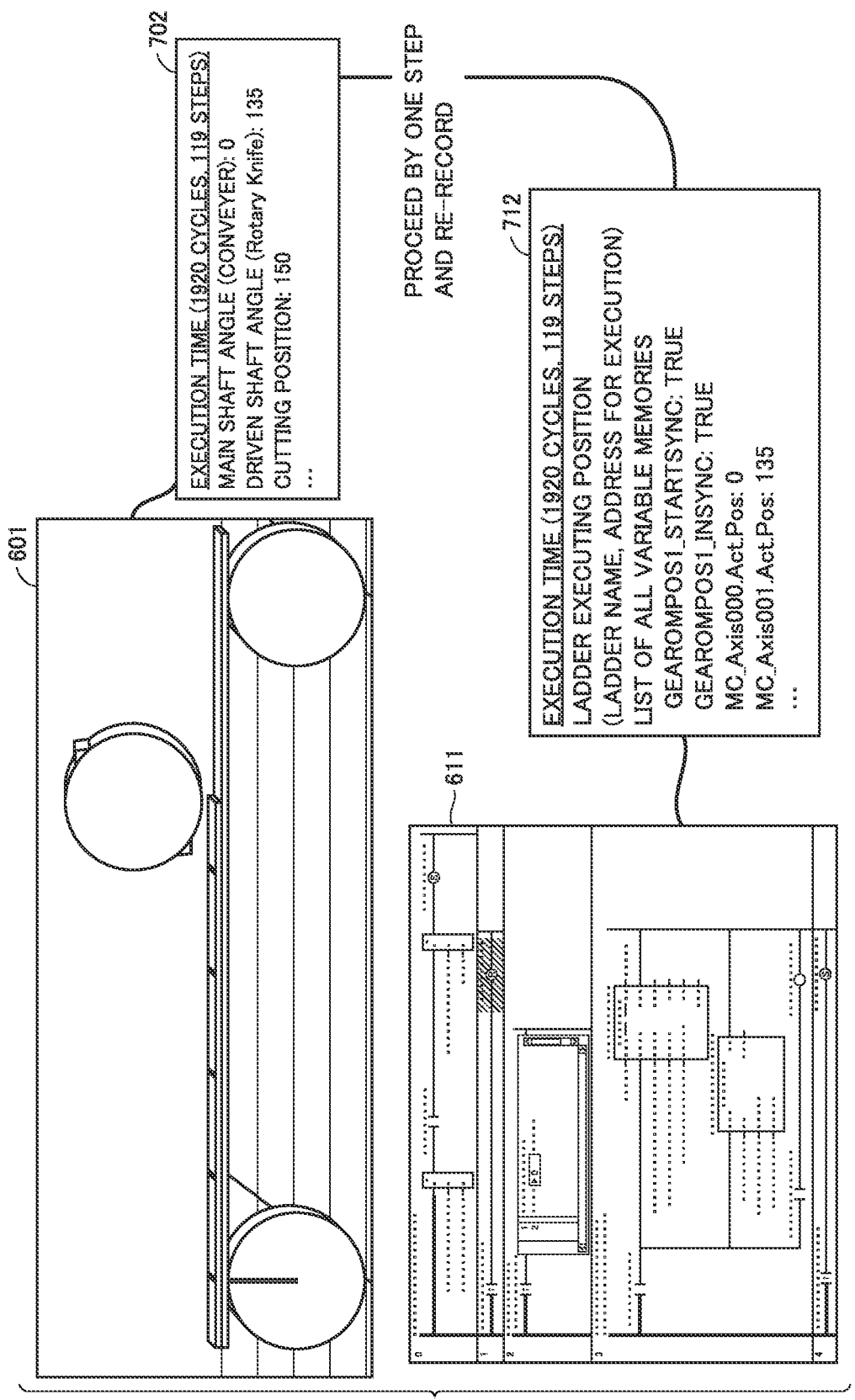
FIG. 7 is a diagram illustrating a second example of ongoing simulation.

FIG. 7 is a diagram illustrating a second example of ongoing simulation. The example illustrated in FIG. 7 indicates that the execution of program 611 has proceeded by one step from the example illustrated in FIG. 6. 3D space 601 includes the objects in the 3D space at an execution time (1920 cycles, 119 steps).

Since PLC 200 has executed program 611 by one step in the simulation, simulation system 500 stores, in repository 570, positional information 702 of the object in the 3D space and a variable value 712 of the program at the execution time (1920 cycles, 119 steps) as simulation log 250.

At the time, "GEAROMPOS1_INSYNC" is the only difference between positional information 602 of the object in the 3D space and variable value 612 of the program at the execution time (1920 cycles, 118 steps) and positional information 702 of the object in the 3D space and variable value 712 of the program at the execution time (1920 cycles, 119 steps). In this case, simulation system 500 stores the differential value, "GEAROMPOS1_INSYNC" in repository 570 as simulation log 250. Thus, simulation system 500 may save the memory capacity of repository 570 by storing, in this repository, the differential to previously recorded simulation log 250.

Figure 8:
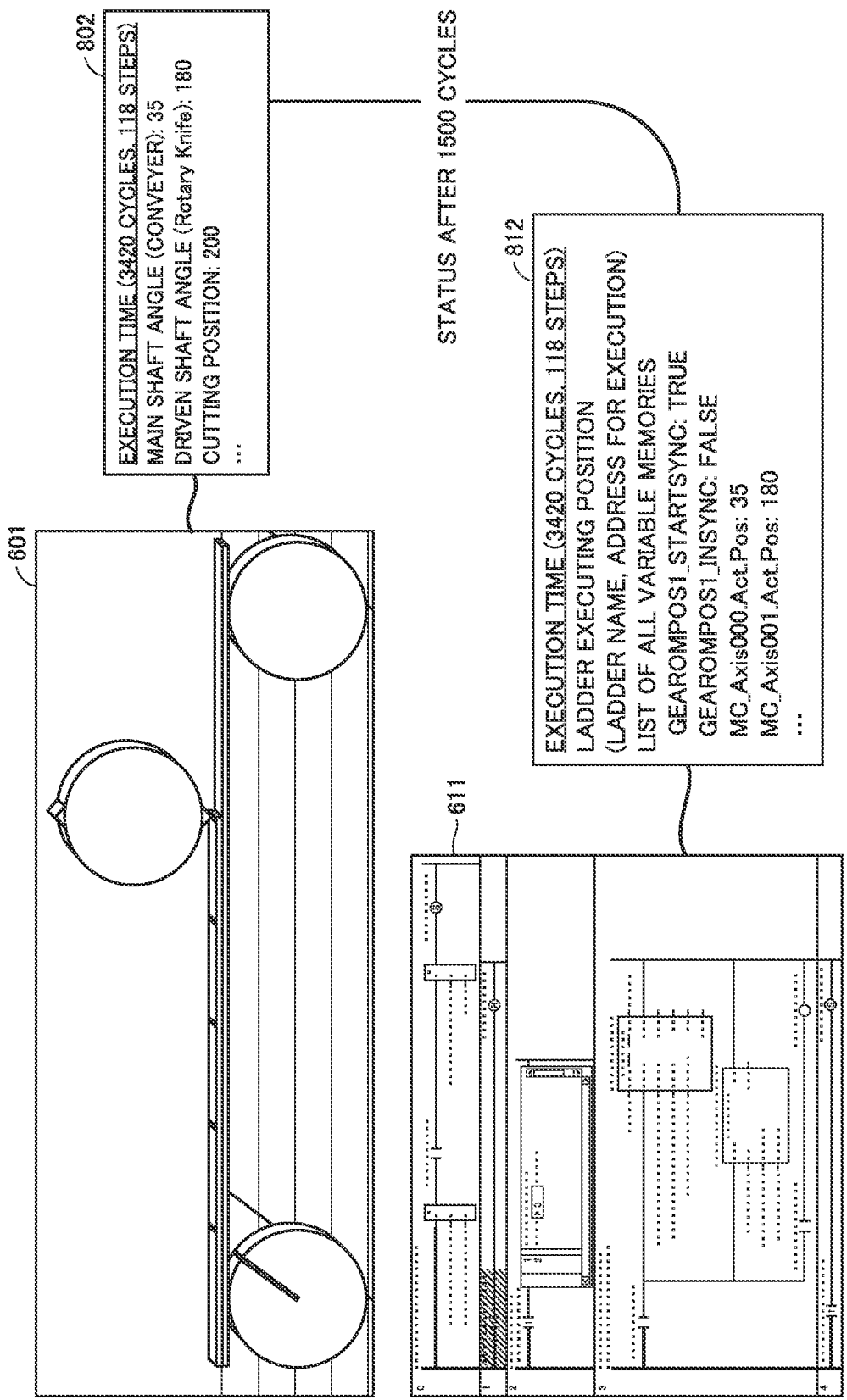
FIG. 8 is a diagram illustrating a third example of ongoing simulation.

FIG. 8 is a diagram illustrating a third example of ongoing simulation. The example illustrated in FIG. 8 indicates that the execution of program 611 has proceeded by 1500 cycles from the example illustrated in FIG. 6. 3D space 601 includes the objects in the 3D space at an execution time (3420 cycles, 118 steps).

Simulation system 500 continues to store simulation log 250 in repository 570 every time when PLC 200 executes program 611 for one step in the simulation. At the time, simulation system 500 stores, in repository 570, only the differential to previously recorded simulation log 250.

At a point in time illustrated in FIG. 8, positional information 802 of the object in the 3D space and a variable value 812 of the program at an execution time further ahead by 1500 cycles (3420 cycles, 118 steps) from a point in time illustrated in FIG. 6 are stored in repository 570 as simulation log 250.

Figure 9:
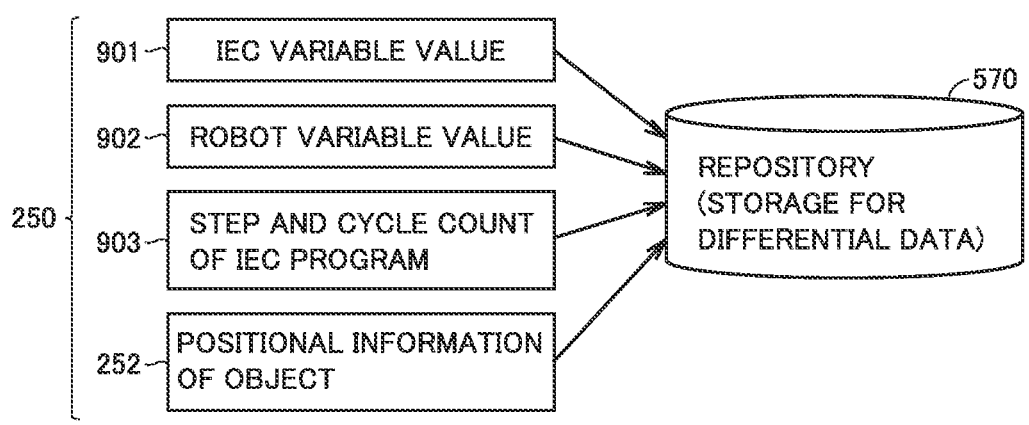
FIG. 9 is a diagram illustrating a first example of data stored in repository 570.

FIG. 9 is a diagram illustrating a first example of data stored in repository 570. In the example illustrated in FIG. 9, simulation log 250 is stored in repository 570. Simulation log 250 includes an IEC variable value 901, a robot variable value 902, a step and cycle count 903 of the IEC program, and positional information 252 of the object in the 3D space.

IEC variable value 901 and robot variable value 902 are included in variable value 254 of the program. IEC variable value 901 includes one or more variable values referred to by the program executed by PLC 200. Robot variable value 902 includes a variable(s) and the like for control of robot hand 210.

Step and cycle count 903 of the IEC program includes the number of times when the program is repeatedly executed (cycles) and a step previously executed. Step and cycle count 903 of the IEC program is associated with positional information 252 of the object in the 3D space and variable value 254 of the program as the simulation execution time (or execution timing).

IEC variable value 901, robot variable value 902, step and cycle count 903 of the IEC program, and positional information 252 of the object are stored in repository 570 for each step as differential information relative to simulation log 250.

In an aspect, it is unnecessary for simulation system 500 to store current simulation log 250 in repository 570 in the case of no differential between current simulation log 250 and simulation log 250 previously stored in repository 570. In another aspect, in the case of no differential between current simulation log 250 and simulation log 250 previously stored in repository 570, simulation system 500 may store step and cycle count 903 of the IEC program in repository 570 instead of storing in repository 570, IEC variable value 901, robot variable value 902, and positional information 252 of the object in the 3D space.

Figure 10:
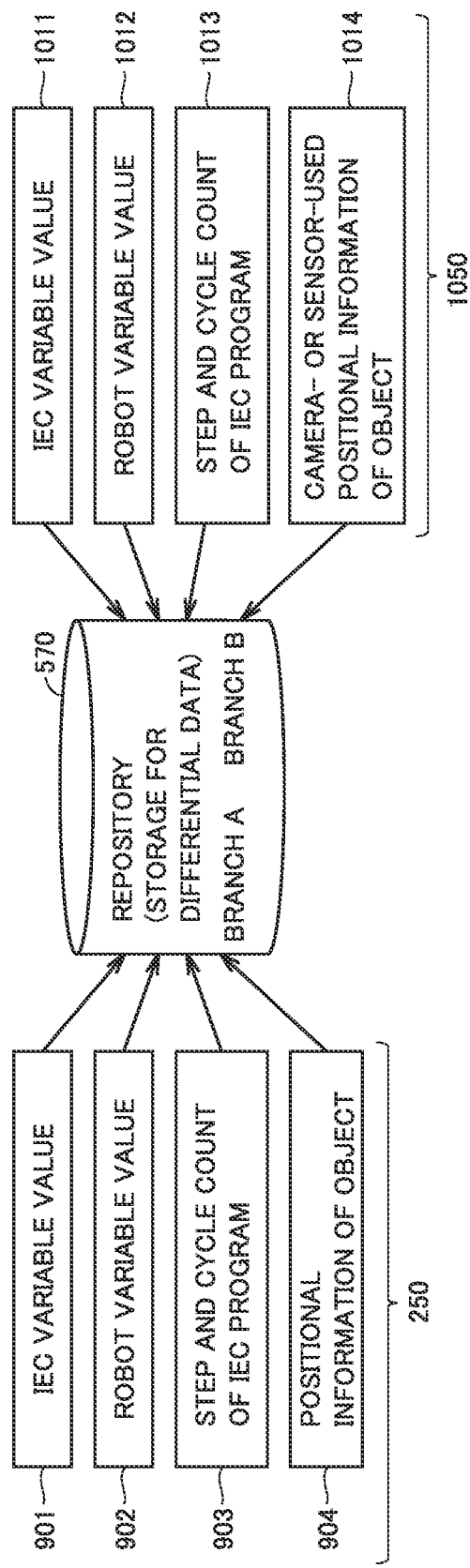
FIG. 10 is a diagram illustrating a second example of data stored in repository 570.

FIG. 10 is a diagram illustrating a second example of data stored in repository 570. In the example illustrated in FIG. 10, simulation log 250 of the program and a log 1050 of the program in the real environment are stored in repository 570.

Log 1050 in the real environment includes an IEC variable value 1011 in the real environment, a robot variable value 1012 in the real environment, a step and cycle count 1013 of the IEC program in the real environment, and positional information 1014 of the object in the real environment.

IEC variable value 1011 in the real environment includes one or more variable values referred to by the program executed by PLC 200 in the real environment.

Robot variable value 1012 in the real environment includes a variable and the like for control of robot hand 210 when the program is executed in the real environment.

Step and cycle count 1013 of the IEC program in the real environment indicates an execution time when the program is executed in the real environment. In an aspect, step and cycle count 1013 of the IEC program in the real environment may include a time stamp calculated from, an execution cycle or the like of the program by PLC 200. In another aspect, simulation system 500 may determine that a point in time when the operation of the device or work is detected by any sensor is the first step of the program in the real environment. Simulation system 500 can synchronize the execution timing of the program in the simulation with the execution timing of the program in the real environment by associating the first step of the program in the real environment with the first step of the program in the simulation.

Positional information 1014 of the object in the real environment indicates the position of the object when the program is executed in the real environment. In an aspect, positional information 1014 of the object in the real environment may be detected with use of a camera (or a 3D camera), a sensor, and the like. Simulation log 250 and log 1050 in the real environment are referred to by real device-simulation data comparator 560. Real device-simulation data comparator 560 may compare the execution results of the program in the simulation and in the real environment by referring to simulation log 250 and log 1050 in the real environment.

In an aspect, simulation system 500 may generate a plurality of branches using a version management system and store simulation log 250 and log 1050 in the real environment in each of the branches.

<D. Program Debugging Steps>

Next, referring to FIGS. 11 to 14, steps of debugging the program using simulation system 500 are described. In the examples illustrated in FIGS. 11 to 14, simulation system 500 reproduces, for each step, simulation log 250 of device 150 recorded in the past.

Figure 11:
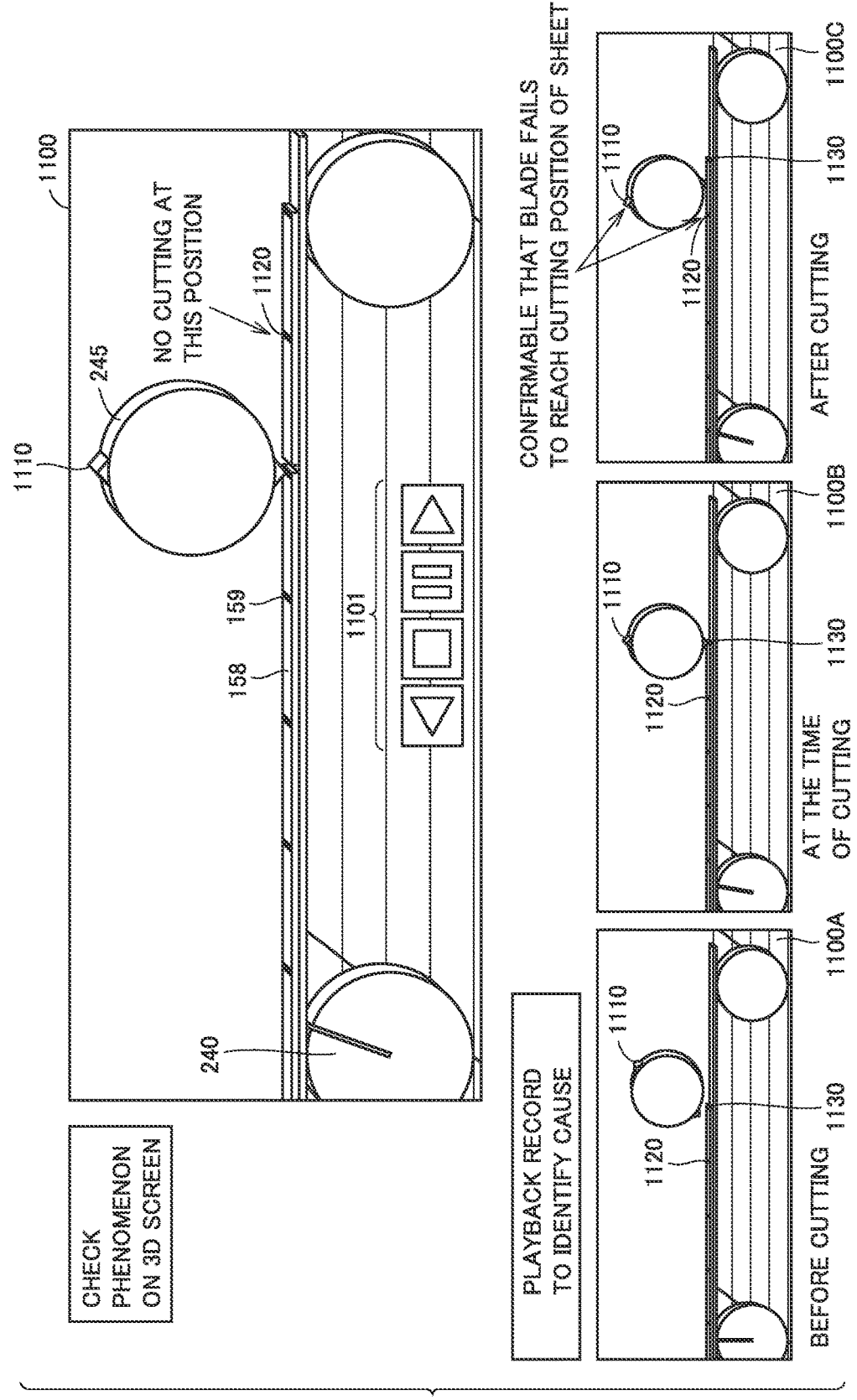
FIG. 11 is a diagram illustrating a first example of a debug screen in simulation system 500.

FIG. 11 is a diagram illustrating a first example of a debug screen in simulation system 500. A screen 1100 includes a simulation scene reproduced based on simulation log 250 of device 150 recorded in the past. Screen 1100 is displayed on display 109. Screen 1100 may include an operational UI 1101 used to input optional operations, for example, reproduction, reverse reproduction and pausing of the simulation scene for each step, and stoppage of the simulation. This may allow a user to update the simulation scene for each step by manipulating operational UI 1101.

Sheet 158 uncut at a cutting position 1120 is displayed on screen 1100. In this case, a user may look into what is causing any trouble of the program by reproducing the simulation scene after tracking the simulation scene back to a point little earlier using operational UI 1101 (for example, around a point in time when sheet 158 is cut at a cutting position 1130 previous to cutting position 1120).

For example, a screen 1100A displays a scene before sheet 158 is cut at cutting position 1130. A screen 1100B displays a scene when sheet 158 is cut at cutting position 1130. A screen 1100C displays a scene after sheet 158 is cut at cutting position 1130. It is known from screens 1100A to 1100C that a blade 1110 fails to reach cutting position 1120 of sheet 158 after sheet 158 is cut at cutting position 1130. In other words, it is known that the rotating speed of driven shaft 245 is behind the speed at which sheet 158 is carried forward. In an aspect, simulation system 500 may display successive simulation scenes, like screens 1100A to 1100C at the same time on display 109.

Thus, a user may easily grasp a problem or the like in the layout and operations of the devices by reproducing or reversely reproducing the simulation screen for each step and correct the program based on the grasped problem.

Figure 12:
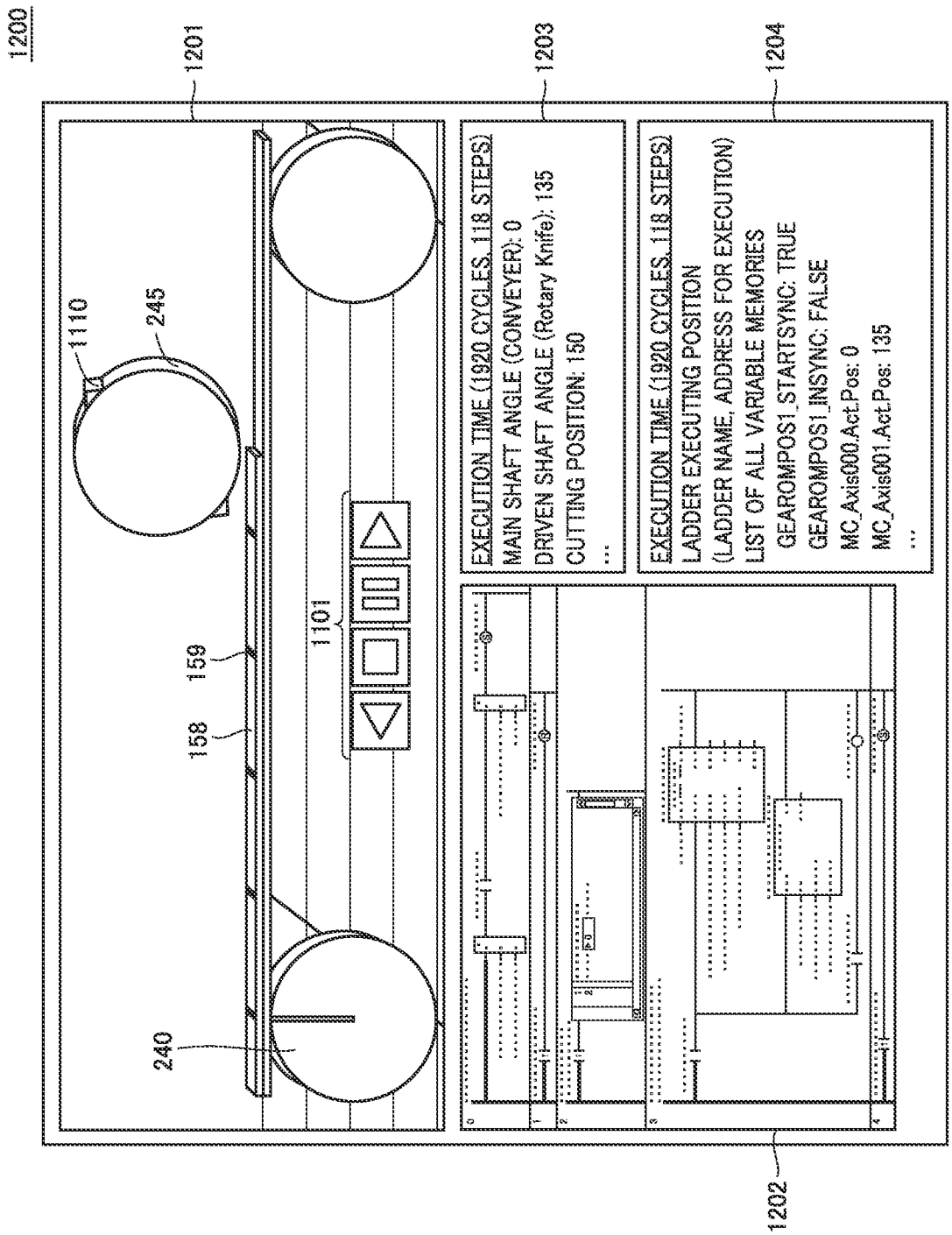
FIG. 12 is a diagram illustrating a second example of the debug screen in simulation system 500.

FIG. 12 is a diagram illustrating a second example of the debug screen in simulation system 500. A screen 1200 includes a simulation scene 1201 reproduced based on simulation log 250 of device 150 recorded in the past (display of the 3D space), a program 1202, positional information 1203 of the object, and a variable value 1204 of the program. In an aspect, simulation system 500 (or PLC simulator 520) may receive an operation input for selection of a variable to be traced. Based on the received operation input for selection of the variable to be traced, simulation system 500 (or PLC simulator 520) may include only the value of variable to be traced into variable value 1204 of the program.

A user may update simulation scene 1201 for each step by manipulating operational UI 1101 to reproduce or reversely reproduce the simulation screen. Every time when simulation scene 1201 is updated for each step, program 1202, positional information 1203 of the object, and variable value 1204 of the program are updated likewise.

For example, when a user finds a problem in simulation scene 1201, the user may check simulation scene 1201 for a few steps before and after the problematic scene by manipulating operational UI 1101. The user may further easily grasp a problem of the program by checking program 1202, positional information 1203 of the object, and variable value 1204 of the program for a few steps before and after the problematic scene at the same time.

Figure 13:
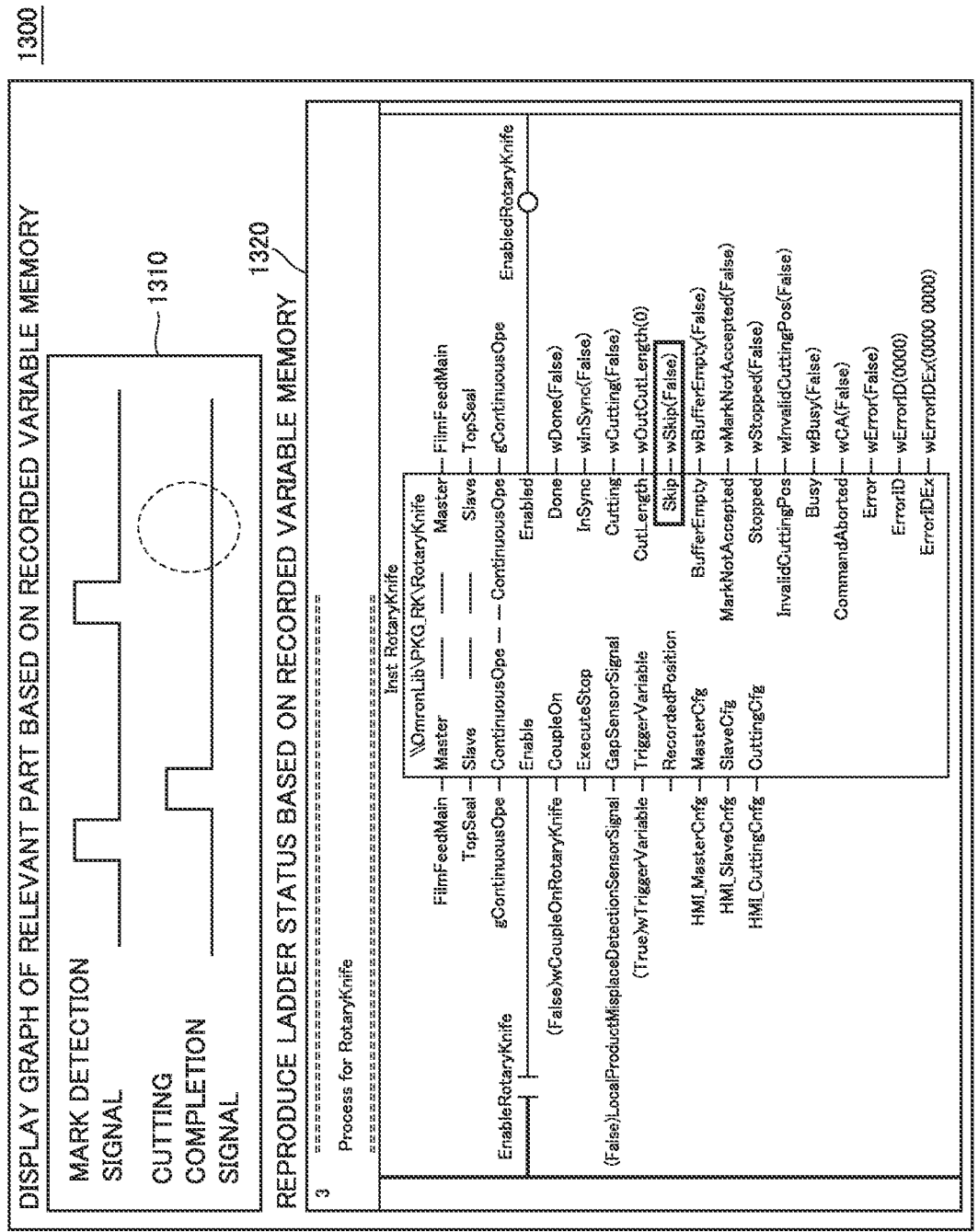
FIG. 13 is a diagram illustrating a third example of the debug screen in simulation system 500.

FIG. 13 is a diagram illustrating a third example of the debug screen in simulation system 500. A screen 1300 includes variable graph 1310 generated based on variable value 254 of the program recorded in the past and program 1320 whose status is reproduced based on variable value 254 of the program recorded in the past.

Simulation system 500 may update each variable value displayed on program 1320 for each step. In an aspect, simulation system 500 may update variable graph 1310 and program 1320 based on the operation input from a user for step reproduction or reverse reproduction. For example, simulation system 500 may reproduce the program operation per execution time by assigning a variable(s) to the program. In yet another aspect, simulation system 500 may highlight and display any variable having a changed value on program 1320.

A user can easily grasp a problem of the program by checking the timing of change of each variable value and change in the program status (program operation) at the same time.

Figure 14:
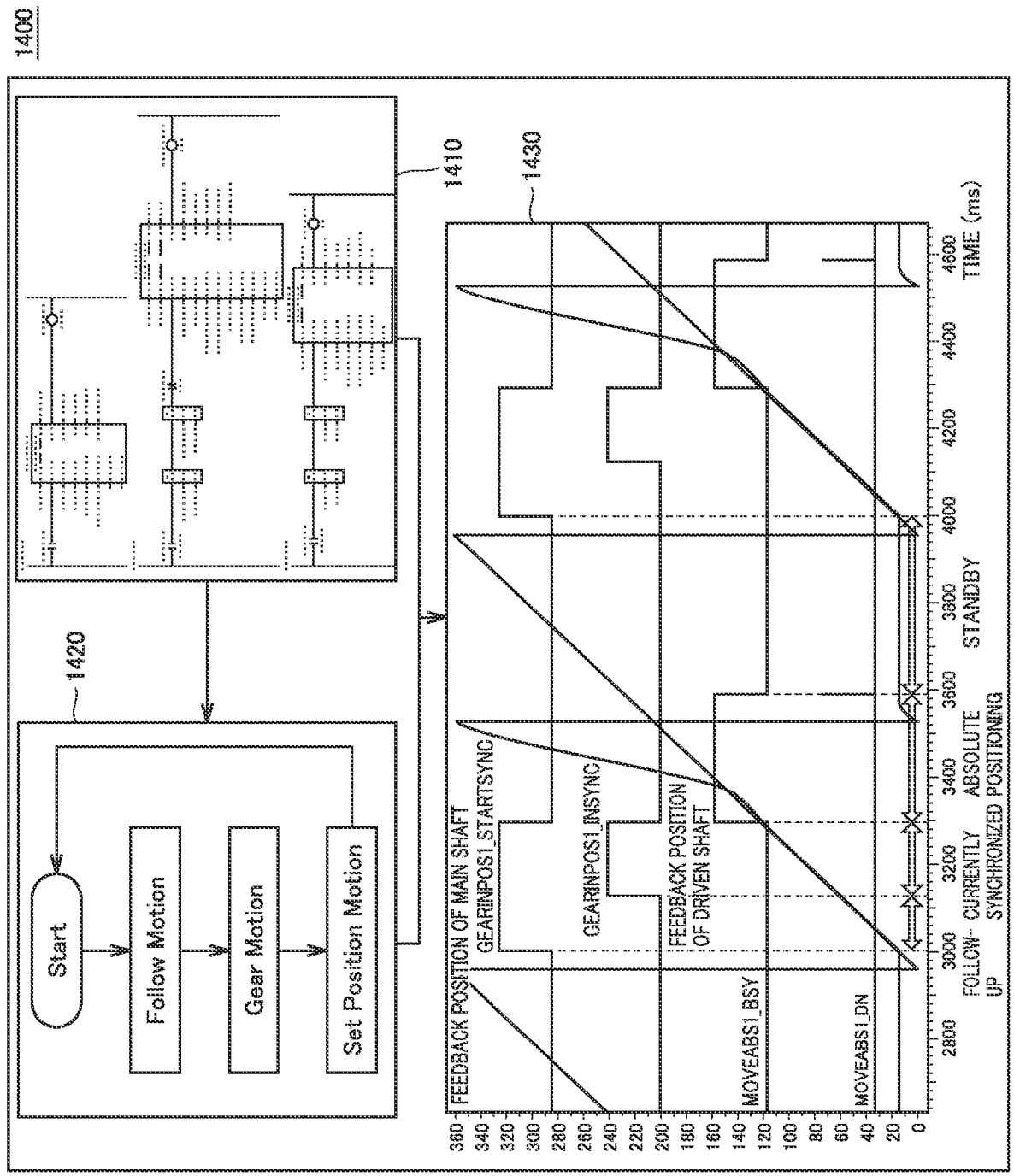
FIG. 14 is a diagram illustrating a fourth example of the debug screen in simulation system 500.

FIG. 14 is a diagram illustrating a fourth example of the debug screen in simulation system 500. A screen 1400 includes a program 1410, a program flowchart 1420, and a variable graph 1430 generated based on variable value 254 of the program recorded in the past.

Simulation system 500 may update each variable value displayed on program 1410 based on the operation input from a user for step reproduction or reverse reproduction. Simulation system 500 may highlight and display a currently executed process on flowchart 1420 based on the operation input from a user for step reproduction or reverse reproduction. Simulation system 500 may update each variable graph 1430 based on the operation input received from a user for step reproduction or reverse reproduction.

Thus, a user can easily grasp a problem of the program by checking the timing of change of each variable value, change in the program status (program operation), and a process on the flowchart currently executed at the same time.

In an aspect, elements included in the screens illustrated in FIGS. 11 to 14 may be optionally combined and displayed on display 109. For example, simulation system 500 may display, on display 109, simulation scene 1201, program 1320 whose status is reproduced based on variable value 254 of the program recorded in the past, flowchart 1420, and variable graph 1430.

<E. Flowchart>

Figure 15:
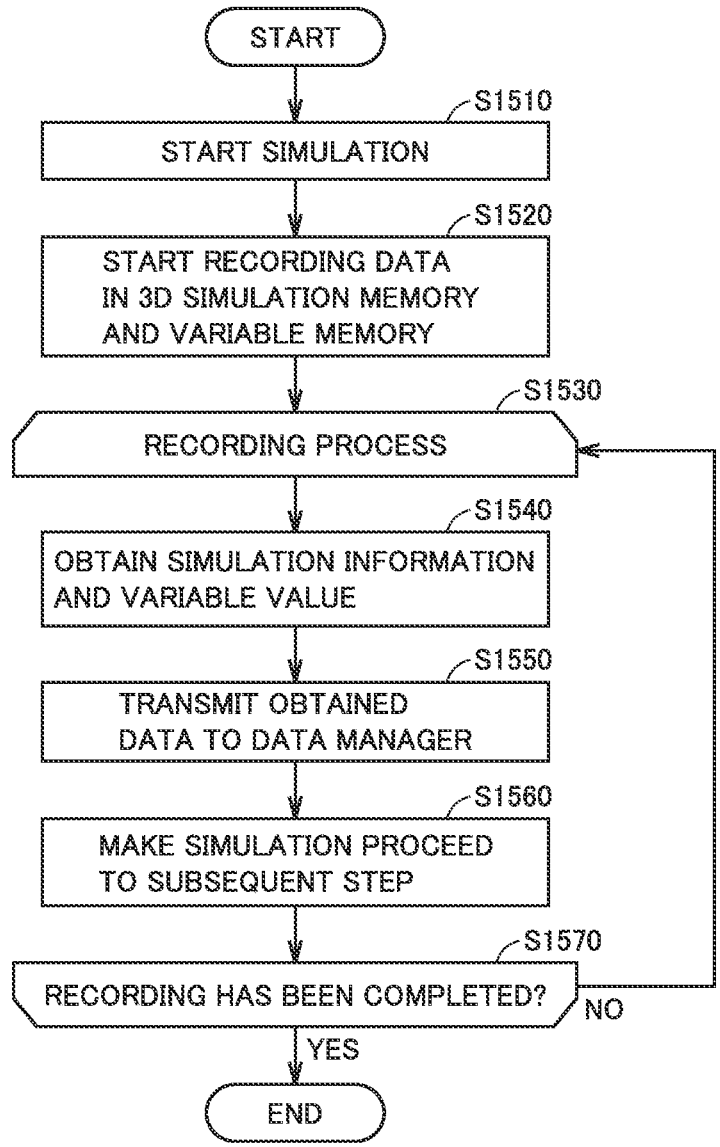
FIG. 15 is a flowchart illustrating an example of a simulation recording process by simulation system 500.
Figure 16:
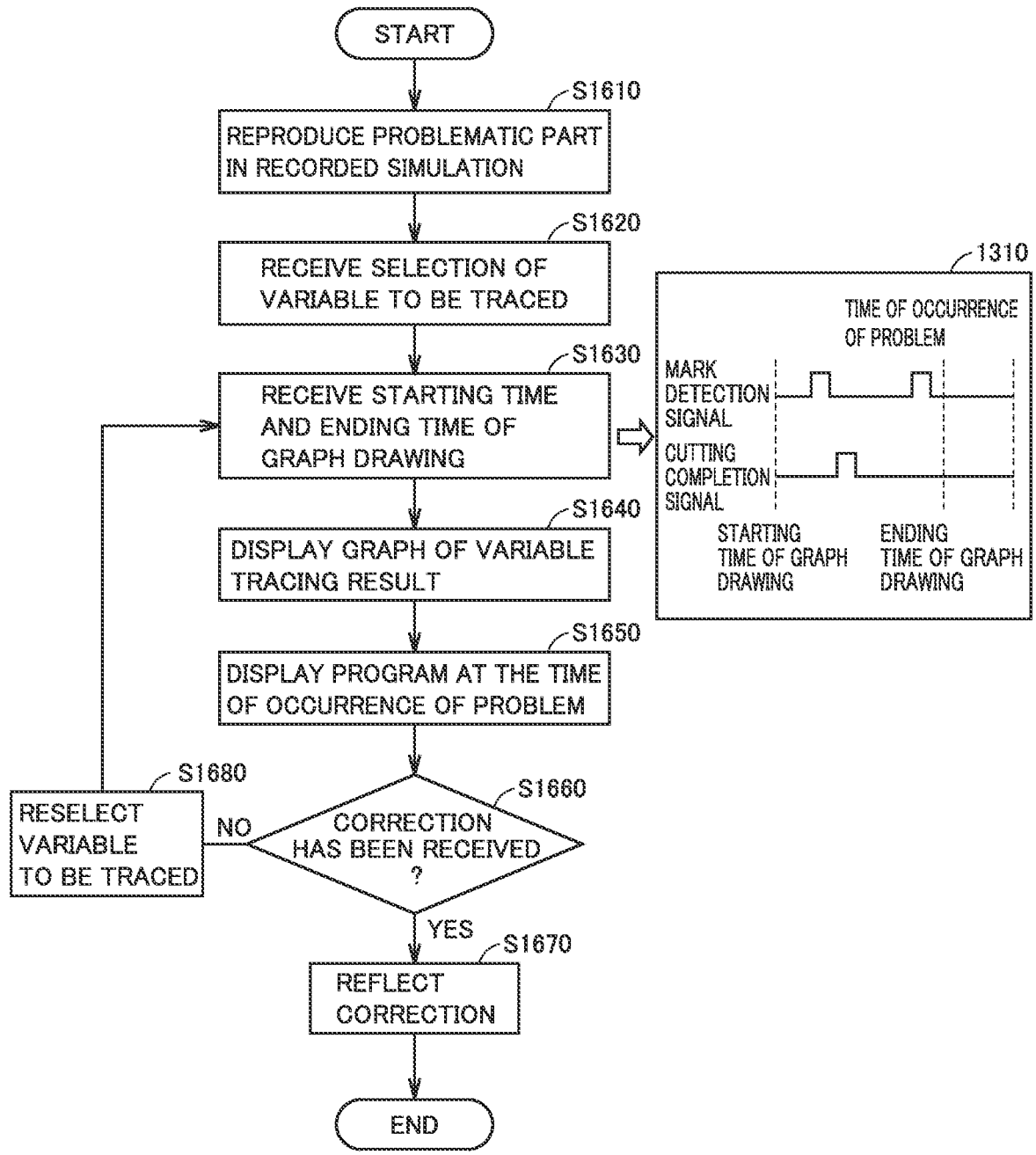
FIG. 16 is a flowchart illustrating an example of the debugging process by simulation system 500.

Next, referring to FIGS. 15 to 17, simulation result recording process and debugging process by simulation system 500 are described. In an aspect processor 102 may read, from storage 111 into main memory 104, a program for processing steps of FIGS. 15 to 17 to be executed (an optional program of integrated developing environment 130) and then execute the program. In another aspect, the processing steps in whole or in part may be actualized in the form of circuit elements combined to execute these steps.

FIG. 15 is a flowchart illustrating an example of a simulation recording process by simulation system 500.

In step S1510, simulation system 500 starts the simulation based on, for example, an operation input from a user for starting the simulation.

In step S1520, simulation system 500 starts to record data in 3D simulation memory 571 and in variable memory 572.

In step S1530, simulation system 500 repeatedly carries out processes in step S1540 and in subsequent steps until the simulation is completed.

In step S1540, simulation system 500 obtains positional information 252 of the object in the 3D space and variable value 254 of the program for each step of the simulation (or of the program).

In step S1550, simulation system 500 transmits the obtained data (simulation log 250, positional information 252 of the object in the 3D space, and variable value 254 of the program) to data manager 550. Data manager 550 commits the obtained data to repository 570.

In step S1560, simulation system 500 makes the simulation (or program) proceed to a subsequent step(s).

In step S1570, simulation system 500 determines whether recording of the simulation is completed. In an aspect, simulation system 500 may determine that recording of the simulation is completed when data for designated cycles is all recorded. In another aspect, simulation system 500 may determine that recording of the simulation is completed when a designated flag is put up (or put down). In yet another aspect, simulation system 500 may determine that recording of the simulation is completed in response to receipt of an operation input for stoppage of the simulation from a user. Simulation system 500 ends the process when it is determined that recording of the simulation is completed (YES in step S1570). Otherwise (NO in step S1570), simulation system 500 makes the process proceed to step S1530. In an aspect, simulation system 500 may carry out the process of step S1570 in step S1530.

In order to record a program execution result in the real environment, simulation system 500 may similarly record the data as described thus far, except for use of camera-captured images, sensor signals, and the like.

FIG. 16 is a flowchart illustrating an example of the debugging process by simulation system 500.

In step S1610, simulation system 500 reproduces a problematic part in the simulation in response to an operation input from a user.

In step S1620, simulation system 500 receives an operation input for selection of a variable to be traced. In an aspect, PLC simulator 520 or data manager 550 may include a feature that receives an operation input for selection of a variable to be traced.

In step S1630, simulation system 500 receives an operation input for designating a starting time and an ending time of graph drawing. In an aspect, the starting time and ending time of graph drawing may be designated based on the numbers of cycles and steps of the program at the starting time and the numbers of cycles and steps of the program at the ending time. The processes of steps S1620 and S1630 may be carried out prior to step S1610.

In step S1640, simulation system 500 displays, on display 109, a graph showing a variable tracing result (corresponding to graph 1310 indicative of variable value changes). Simulation system 500 may display, on display 109, a graph representing a designated period in response to the input for designating the starting time and ending time of graph drawing in step S1630.

In step S1650, simulation system 500 displays, on display 109, the program when a problem occurs. For example, simulation system 500 may display, on display 109, the program (variable-inputted program) corresponding to an execution time (steps and cycles) of a relevant problematic simulation scene in response to the simulation scene being displayed on display 109 in step S1610.

In step S1660, simulation system 500 determines whether an operation input for request of program correction has been received. When it is determined that the program correction request has been received (YES in step S1660), simulation system 500 makes the process proceed to step S1670. Otherwise (NO in step S1660), simulation system 500 makes the process proceed to step S1680.

In step S1670, simulation system 500 reflects the correction in the program.

In step S1680, simulation system 500 receives an operation input for reselection of the variable to be traced. For example, a user reselects the variable to be traced when the problematic part of the program displayed in step S1650 fails to be identified, so that the user can search the problematic part of the program from a different perspective.

FIG. 17 is a flowchart illustrating an example of a comparison process for between a program simulation result by simulation system 500 and a program execution result in a real environment.

In step S1710, simulation system 500 receives an operation input for condition settings to start the comparison. The comparison-start conditions include conditions under which execution times in the simulation and in the real environment are associated with each other. In an aspect, simulation system 500 may, for example, associate the timing of signal output in response to detection of a work or device operation using a particular sensor in the real environment with the execution time in the simulation (0 cycle, one step).

In step S1720, simulation system 500 compares simulation log 250 and log 1050 in the real environment at the same execution time (with the same number of program cycles and steps). In an aspect, simulation system 500 may compare the variable values or pieces of positional information of the object included in each log or may compare both of these values and information.

In step S1730, simulation system 500 determines whether a differential is found between simulation log 250 and log 1050 in the real environment. When it is determined that the differential is found between simulation log 250 and log 1050 in the real environment (YES in step S1730), simulation system 500 makes the process proceed to step S1740. Otherwise (NO in step S1730), simulation system 500 makes the process proceed to step S1720.

In step S1740, simulation system 500 displays the name and value of a differential-identified variable and simulation information. The simulation information described herein includes a simulation scene(s) in differential-confirmed step. In an aspect, the simulation information may include positional information 252 of the object in the 3D space.

In step S1750, simulation system 500 determines whether a comparison process ending request is received. For example, simulation system 500 may receive the comparison process ending request through operation unit 106 or network interface 110. Simulation system 500 ends the process when it is determined that the comparison process ending request has been received (YES in step S1750). Otherwise (NO in step S1750), simulation system 500 makes the process proceed to step S1720.

As described thus far, simulation system 500 according to this embodiment includes a feature that records variable value 254 of the program and positional information 252 of the object in the 3D space during the ongoing simulation in a manner that they are associated with each other per execution time. Simulation system 500 further includes a feature that performs per-step reproduction and reverse reproduction of the simulation using positional information 252 of the object in the 3D space and variable value 254 of the program. Simulation system 500 further includes a feature that displays variable value 254 of the program and positional information 252 of the object in the 3D space for each step. These features may allow a user to reproduce the simulation per step and easily identify a simulation scene(s) suggesting trouble with the operation of any device. Then, a user may easily debug the program by referring to variable value 254 of the program in any problematic simulation scene.

Simulation system 500 further includes a feature that compares simulation log 250 and log 1050 in the real environment against each other. This may allow a user to easily grasp a problem of the program in the real environment or a problem of the layout of devices.

<F. Supplementary Note>

As described thus far, the embodiments disclosed herein include the following technical aspects.

[Aspect 1]

The simulation system (500) including:
- a simulator (520) configured to execute a simulation of an operation of one or more devices;
- a data input unit (551) configured to obtain one or more execution times in the simulation, positional information (252) of each one of one or more objects in the simulation, and a value (254) of each one of one or more variables referred to by a program to operate the one or more devices;
- a data recorder (554) configured to store, as a first log (250), the positional information (252) of the one or more objects and the value (254) of the one or more variables for each of the one or more execution times in a manner that the positional information and the value are associated with each other; and
- a displayer configured to display the positional information (252) of the one or more objects and the value of the one or more variables for each of the one or more execution times included in the first log (250).

[Aspect 2]

The simulation system (500) according to aspect 1, wherein
the simulator (520) is configured to reproduce the simulation while stopping the simulation for each of the one or more execution times based on the first log (250), and
the displayer is configured to display a screen of the simulation for each of the one or more execution times and the first log (250) for each of the execution times.

[Aspect 3]

The simulation system (500) according to aspect 1 or 2, wherein
the simulator (520) is configured to reversely reproduce the simulation while stopping the simulation for each of the one or more execution times based on the first log (250), and
the displayer is configured to display a screen of the simulation for each of the one or more execution times and the first log (250) for each of the execution times.

[Aspect 4]

The simulation system (500) according to any one of aspects 1 to 3, further including a data differential extractor (553) configured to extract a differential between the first log (250) and data previously recorded,
wherein
the data recorder (554) is configured to store the differential.

[Aspect 5]

The simulation system (500) according to any one of aspects 1 to 4, wherein
the data input unit (551) further includes a feature that obtains one or more time stamps in a real environment, positional information (252) of one or more objects in the real environment, and a value (254) of one or more variables referred to by the program to operate the one or more devices in the real environment, and
the data recorder (554) further includes a feature that stores, as a second log, the positional information (252) of the one or more objects in the real environment and the value (254) of the one or more variables referred to by the program to operate the one or more devices in the real environment for each of the one or more time stamps in the real environment in a manner that the positional information and the value are associated with each other.

[Aspect 6]

The simulation system (500) according to aspect 5, further including a synchronizer (561) configured to allow an execution time of the first log (250) and an execution time of the second log to correspond to each other,
wherein
the displayer is configured to display the first log (250) and the second log at a same execution time.

[Aspect 7]

The simulation system (500) according to any one of aspects 1 to 6, wherein
the displayer is configured to display a graph of the value of the one or more variables for each of the one or more execution times included in the first log (250).

[Aspect 8]

The simulation system (500) according to any one of aspects 1 to 7, wherein
the displayer is configured to display an operation of the program while reproducing the operation based on the value of the one or more variables for each of the one or more execution times included in the first log (250).

[Aspect 9]

The simulation system (500) according to any one of aspects 1 to 8, wherein
the displayer is configured to display a screen of the simulation for each of the one or more execution times in the simulation and a flowchart of the program for each of the one or more execution times in the simulation, and
the displayer is configured to highlight and display a process on the flowchart currently executed for each of the one or more execution times in the simulation.

[Aspect 10]

The simulation system (500) according to any one of aspects 1 to 9, wherein the simulator (520) further includes a feature that receives an input for selection of a variable having a value to be traced for each of the one or more execution times from the one or more variables included in the program.

[Aspect 11]

The simulation system (500) according to any one of aspects 1 to 10, wherein the simulator (520) further includes a feature that receives an input for setting a reproduction starting time and a reproduction ending time of the simulation.

[Aspect 12]

The simulation system (500) according to any one of aspects 1 to 11, wherein the data recorder is configured to record a cycle and step count when the program is executed as an execution time in the simulation.

[Aspect 13]

A method executable by a simulation system (500), including:
executing a simulation of an operation of one or more devices;
obtaining one or more execution times in the simulation, positional information (252) of one or more objects in the simulation, and a value (254) of one or more variables referred to by a program to operate the one or more devices;
storing, as a first log (250), the positional information (252) of the one or more objects and the value (254) of the one or more variables for each of the one or more execution times in a manner that the positional information (252) and the value (254) are associated with each other; and
displaying the positional information (252) of the one or more objects and the value of the one or more variables for each of the one or more execution times included in the first log (250).

[Aspect 14]

A program causing one or more processors to execute the method according to aspect 13.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A simulation system, comprising:
a simulator configured to execute a simulation of an operation of one or more devices;
a data input unit configured to obtain one or more execution times in the simulation, positional information of each one of one or more objects in the simulation, and a value of each one of one or more variables referred to by a program to operate the one or more devices;

a data recorder configured to store, as a first log, the positional information of the one or more objects and the value of the one or more variables for each of the one or more execution times in a manner that the positional information and the value are associated with each other; and a displayer configured to display the positional information of the one or more objects and the value of the one or more variables for each of the one or more execution times included in the first log.

2. The simulation system according to claim 1, wherein
the simulator is configured to reproduce the simulation while stopping the simulation for each of the one or more execution times based on the first log, and
the displayer is configured to display a screen of the simulation for each of the one or more execution times and the first log for each of the execution times.

3. The simulation system according to claim 1, wherein
the simulator is configured to reversely reproduce the simulation while stopping the simulation for each of the one or more execution times based on the first log, and
the displayer is configured to display a screen of the simulation for each of the one or more execution times and the first log for each of the execution times.

4. The simulation system according to claim 1, further comprising a data differential extractor configured to extract a differential between the first log and data previously recorded,
wherein the data recorder is configured to store the differential.

5. The simulation system according to claim 1, wherein
the data input unit further includes a feature that obtains one or more time stamps in a real environment, positional information of one or more objects in the real environment, and a value of one or more variables referred to by the program to operate the one or more devices in the real environment, and
the data recorder further includes a feature that stores, as a second log, the positional information of the one or more objects in the real environment and the value of the one or more variables referred to by the program to operate the one or more devices in the real environment for each of the one or more time stamps in the real environment in a manner that the positional information and the value are associated with each other.

6. The simulation system according to claim 5, further comprising a synchronizer configured to allow an execution time of the first log and an execution time of the second log to correspond to each other,
wherein the displayer is configured to display the first log and the second log at a same execution time.

7. The simulation system according to claim 1, wherein the displayer is configured to display a graph of the value of the one or more variables for each of the one or more execution times included in the first log.

8. The simulation system according to claim 1, wherein the displayer is configured to display an operation of the program while reproducing the operation based on the value of the one or more variables for each of the one or more execution times included in the first log.

9. The simulation system according to claim 1, wherein
the displayer is configured to display a screen of the simulation for each of the one or more execution times in the simulation and a flowchart of the program for each of the one or more execution times in the simulation, and the displayer is configured to highlight and display a process on the flowchart currently executed for each of the one or more execution times in the simulation.

10. The simulation system according to claim 1, wherein the simulator further includes a feature that receives an input for selection of a variable having a value to be traced for each of the one or more execution times from the one or more variables included in the program.

11. The simulation system according to claim 1, wherein the simulator further includes a feature that receives an input for setting a reproduction starting time and a reproduction ending time of the simulation.

12. The simulation system according to claim 1, wherein the data recorder is configured to record a cycle and step count when the program is executed as an execution time in the simulation.

13. A method executable by a simulation system, comprising:
executing a simulation of an operation of one or more devices;
obtaining one or more execution times in the simulation, positional information of one or more objects in the simulation, and a value of one or more variables referred to by a program to operate the one or more devices;
storing, as a first log, the positional information of the one or more objects and the value of the one or more variables for each of the one or more execution times in a manner that the positional information and the value are associated with each other; and
displaying the positional information of the one or more objects and the value of the one or more variables for each of the one or more execution times included in the first log.

14. The method according to claim 13, wherein executing the simulation includes reproducing the simulation while stopping the simulation for each of the one or more execution times based on the first log, and
further comprising displaying a screen of the simulation for each of the one or more execution times and the first log for each of the execution times.

15. The method according to claim 13, wherein executing the simulation includes reversely reproducing the simulation while stopping the simulation for each of the one or more execution times based on the first log, and
further comprising displaying a screen of the simulation for each of the one or more execution times and the first log for each of the execution times.

16. The method according to claim 13, further comprising:
extracting a differential between the first log and data previously recorded; and
storing the differential.

17. The method according to claim 13, further comprising:
obtaining one or more time stamps in a real environment, positional information of one or more objects in the real environment, and a value of one or more variables referred to by the program to operate the one or more devices in the real environment; and
storing, as a second log, the positional information of the one or more objects in the real environment and the value of the one or more variables referred to by the program to operate the one or more devices in the real environment for each of the one or more time stamps in the real environment in a manner that the positional information and the value are associated with each other.

18. The method according to claim 17, further comprising:
allowing an execution time of the first log and an execution time of the second log to correspond to each other; and
displaying the first log and the second log at a same execution time.

19. The method according to claim 13, further comprising displaying a graph of the value of the one or more variables for each of the one or more execution times included in the first log.

20. A non-transitory computer-readable medium comprising instructions that, when executed by a simulation system, cause the simulation system to:

execute a simulation of an operation of one or more devices;
obtain one or more execution times in the simulation, positional information of one or more objects in the simulation, and a value of one or more variables referred to by a program to operate the one or more devices;
store, as a first log, the positional information of the one or more objects and the value of the one or more variables for each of the one or more execution times in a manner that the positional information and the value are associated with each other; and
display the positional information of the one or more objects and the value of the one or more variables for each of the one or more execution times included in the first log.

* * * * *